United States Patent [19]
Takagi et al.

[11] Patent Number: 5,912,602
[45] Date of Patent: Jun. 15, 1999

[54] SURFACE ACOUSTIC WAVE DEVICE AND METHOD FOR DESIGNING SAME USING RESONATORS HAVING DIFFERENT FREQUENCY-TEMPERATURE CHARACTERISTICS

[75] Inventors: Michiaki Takagi; Shigeo Kanna; Eishi Momosaki, all of Suwa, Japan

[73] Assignee: Seiko Epson Corporation, Suwa, Japan

[21] Appl. No.: 08/731,752

[22] Filed: Oct. 18, 1996

[30] Foreign Application Priority Data

| Oct. 20, 1995 | [JP] | Japan | 7-273245 |
| Mar. 6, 1996 | [JP] | Japan | 8-049019 |
| Sep. 4, 1996 | [JP] | Japan | 8-234561 |

[51] Int. Cl.⁶ .............................. H03H 9/25; H03H 9/64
[52] U.S. Cl. .................. 333/193; 333/195; 310/313 D
[58] Field of Search .................. 333/193–196; 310/313 R, 313 B, 313 C, 313 D, 346

[56] References Cited

U.S. PATENT DOCUMENTS

| 4,193,045 | 3/1980 | Houkawa et al. | 333/193 X |
| 5,581,141 | 12/1996 | Yamada et al. | 333/195 X |

FOREIGN PATENT DOCUMENTS

| 55-121729 | 9/1980 | Japan . | |
| 58-39105 | 3/1983 | Japan . | |
| 60-196007 | 10/1985 | Japan | 333/193 |
| 61-142812 | 6/1986 | Japan | 333/195 |
| 5-251986 | 9/1993 | Japan | 333/195 |
| 6-169231 | 6/1994 | Japan | 333/193 |
| 8-70232 | 3/1996 | Japan . | |

OTHER PUBLICATIONS

Takagi et al., "K–Cut Saw Resonator With Both Static and Dynamic Zero Temperature Coefficients"; *Proceedings of the 1996 IEEE International Frequency Control Symposium*; IEEE Catalog No. 96CH35935; Jun. 5–7, 1996; pp. 278–285.

*Primary Examiner*—Robert Pascal
*Assistant Examiner*—Barbara Summons
*Attorney, Agent, or Firm*—Oliff & Berridge, PLC

[57] ABSTRACT

A high-precision surface acoustic wave (SAW) device improves the frequency-temperature characteristics of a conventional surface acoustic wave device several-fold. In this high-precision surface acoustic wave device, two one-port SAW resonators, or two two-port SAW resonators, alternatively, two one-port-resonator-type, two-port-resonator-type or transversal-type filters are placed in parallel with each other. Further, these resonators or filters are excited and are elastically coupled to each other in such a way as to be in an oblique symmetry mode. Moreover, the frequency-temperature characteristics of the two elements are made to differ from each other. Furthermore, a flat frequency-temperature characteristic, which cannot be realized by a single element, is realized by being synthesized from the frequency-temperature characteristics of the two elements.

23 Claims, 25 Drawing Sheets

100 PIEZOELECTRIC PLATE
101, 102 IDTs
103~106 REFLECTORS

SURFACE ACOUSTIC WAVE DEVICE AND METHOD FOR DESIGNING SAME USING RESONATORS HAVING DIFFERENT FREQUENCY-TEMPERATURE CHARACTERISTICS

BACKGROUND OF THE INVENTION

1. Field of the Invention

The present invention generally relates to a surface acoustic wave (hereunder sometimes abbreviated as SAW) device for achieving frequency stabilization and frequency control by using surface acoustic wave, and more particularly to a SAW device whose frequency-temperature characteristics are noticeably improved.

2. Description of the Related Art

Among conventional SAW devices, one-port SAW resonators and two-port SAW resonators are well known as those used for frequency stabilization and frequency control. Especially, a SAW resonator using an ST-cut quartz crystal as a substrate has a zero temperature coefficient at ordinary temperature and is of high accuracy. However, the secondary temperature coefficient β of the aforementioned ST-cut quartz crystal substrate is $-3.3 \times 10^{-8}/°\,C.^2$, so that the frequency-temperature characteristics or change is approximately ±60 ppm in the temperature range of −35 to 85° C., at which mobile communication systems or devices are used. Therefore, the SAW resonator using an ST-cut quartz crystal substrate has inadequate characteristics and thus cannot be used in a mobile communication device. There is a known method for improving the frequency-temperature characteristics of a SAW device against this by which two SAW devices are used by being electrically connected in parallel with each other (see Japanese Unexamined Patent Publication No. 55-121729 and Japanese Unexamined Patent Publication No.58-39105).

However, in the case of the aforementioned conventional method, the coupling coefficients of each of the two SAW devices is determined by the capacitance of a capacitor (the load capacitance CL), which is an external or outboard device, so that the frequency-temperature characteristics are realized. Thus, in the case of an oscillation circuit comprising two SAW devices, the frequency of a signal generated by the circuit is determined by the same capacitance CL. Consequently, the circuit lacks flexibility in regulating the frequency. Further, in the case of the SAW devices used as a filter, the filter lacks flexibility in setting terminal impedance and is, therefore, very inconvenient.

It is, accordingly, an object of the present invention to improve the frequency-temperature characteristics of a SAW element or device and to provide a SAW device, which excels at frequency accuracy and is very convenient, to the market.

SUMMARY OF THE INVENTION

To achieve the foregoing object, in accordance with an aspect of the present invention, there is provided a surface acoustic wave device (hereunder sometimes referred to as a first surface acoustic wave device) that comprises a plurality of surface acoustic wave resonators placed on a piezoelectric plate in such a way as to be proximate to one another. In this device, each of the plurality of surface acoustic wave resonators consists of at least one interdigital transducer and at least one pair of reflectors. Further, the plurality of surface acoustic wave resonators are adapted to have different frequency-temperature characteristics, respectively.

Moreover, the transverse elastic coupling of the plurality of surface acoustic wave resonators is performed in such a way that the plurality of surface acoustic wave resonators compose a single coupling (or synthetic) resonator.

Thus, excellent frequency-temperature characteristics, which cannot be realized by a single element, are realized. Thereby, a surface acoustic wave device can be used in a portable mobile communication device which requires high-precision frequencies. Consequently, miniaturization, the saving of labor required for production and increased performance of the surface acoustic wave device can be achieved. It, therefore, can be expected that the device of the present invention will yield a great deal of advantages in the future.

Furthermore, a plurality of surface acoustic wave devices of the present invention have displacements that are elastically coupled to one another and oscillate.

In the case of a second embodiment (hereunder sometimes referred to as a second surface acoustic wave device) of the present invention, the condition or state of the transverse elastic coupling is determined according to the following equation:

$$a\omega_0^2(\partial^2 V(Y)/\partial Y^2)+(\omega^2-\omega_0^2)V(Y)=0$$

where ω designates an angular frequency; $\omega_0$ an element angular frequency (rad/s) of a concerned or corresponding region; V(Y) an amplitude of a surface acoustic wave displacement in the direction of width; Y a Y-coordinate of the surface acoustic wave device, which is normalized in terms of the wavelength of a surface acoustic wave; and a a constant.

Further, in the case of a third embodiment (hereunder sometimes referred to as a third surface acoustic wave device) of the present invention, the plurality of surface acoustic wave devices are in an oblique symmetry mode in which a transverse elastic coupling of respective displacements is performed and the displacements oscillate in such a way as to be of opposite phase, respectively.

Moreover, in the case of a fourth embodiment (hereunder sometimes referred to as a fourth surface acoustic wave device) of the present invention, the oblique symmetry mode is a fundamental wave mode A0 as illustrated in FIGS. 3 and 15.

Moreover, in the case of a fifth embodiment (hereunder sometimes referred to as a fifth surface acoustic wave device) of the present invention, the surface acoustic wave resonator is of the one-port type.

Furthermore, in the case of a sixth embodiment (hereunder sometimes referred to as a sixth surface acoustic wave device) of the present invention, the surface acoustic wave resonator is of the two-port type.

An example of the one-port surface acoustic wave resonator and an example of the two-port surface acoustic wave resonator are illustrated in FIGS. 1 and 2, respectively.

In the case of a seventh embodiment (hereunder sometimes referred to as a seventh surface acoustic wave device) of the present invention, the frequency-temperature characteristics have different peak temperatures and are represented by nearly-quadratic functions, each of which is upwardly convex, respectively.

Further, in the case of an eighth embodiment (hereunder sometimes referred to as an eighth surface acoustic wave device) of the present invention, a difference Δθ between the peak temperatures of the frequency-temperature characteristics of each pair of the surface acoustic wave resonators is within a range of 30 to 80° C.

Moreover, in the case of a ninth embodiment (hereunder sometimes referred to as a ninth surface acoustic wave device) of the present invention, a differences Δθ between the peak temperatures of the frequency-temperature characteristics of each pair of the surface acoustic wave resonators is realized by making the film thicknesses of the interdigital transducers differ from one another.

Furthermore, in the case of a tenth embodiment (hereunder sometimes referred to as a tenth surface acoustic wave device) of the present invention, a difference Δθ between the peak temperatures of the frequency-temperature characteristics of each pair of the surface acoustic wave resonators is realized by making the line widths of the interdigital transducers differ from one another.

Additionally, in the case of an eleventh embodiment (hereunder sometimes referred to as an eleventh surface acoustic wave device) of the present invention, the interdigital transducer of each of the surface acoustic wave resonators has a first interdigital sub-transducer and a second interdigital sub-transducer. Further, these sub-transducers are connected in parallel with each other and are driven or excited in such a way as to be of opposite phases, respectively.

Thus, the impedance of each of the resonators can be reduced.

Further, in the case of a twelfth embodiment (hereunder sometimes referred to as a twelfth surface acoustic wave device) of the present invention, the interdigital transducer of each of the surface acoustic wave resonators has a first interdigital sub-transducer and a second interdigital sub-transducer. Further, these sub-transducers are connected in series with each other and are driven or excited in such a manner as to be of opposite phases, respectively.

Thus, the electrode pattern can be simplified.

Further, in the case of a thirteenth embodiment (hereunder sometimes referred to as a thirteenth surface acoustic wave device) of the present invention, the piezoelectric plate is a K-cut quartz crystal.

An example of a K-cut crystal is illustrated in FIG. 4.

In the case of an embodiment of the thirteenth surface acoustic wave device, a constant a, by which a transverse mode frequency of the surface acoustic wave resonator is determined, is in the range of 0.01 to 0.02.

Further, in the case of an embodiment of the thirteenth surface acoustic wave device, a distance between each pair of the surface acoustic wave resonators is 1 to 5 times the wavelength of a surface acoustic wave.

Moreover, in the case of an embodiment of the thirteenth surface acoustic wave device, a finger overlap (width) of each of the surface acoustic wave resonators is 10 to 30 times the wavelength of a surface acoustic wave.

Furthermore, in the case of a fourteenth embodiment (hereunder sometimes referred to as a fourteenth surface acoustic wave device) of the present invention, the piezoelectric plate is an ST-cut crystal.

An example of an ST-cut quartz crystal is illustrated in FIG. 16.

In the case of an embodiment of the fourteenth surface acoustic wave device, a constant a, by which a transverse mode frequency of each of the surface acoustic wave resonators is determined, is in the range of 0.03 to 0.04.

Further, in the case of an embodiment of the fourteenth surface acoustic wave device, a distance between each pair of the surface acoustic wave resonators is 1 to 5 times the wavelength of a surface acoustic wave.

Moreover, in the case of an embodiment of the fourteenth surface acoustic wave device, a finger overlap of each of the surface acoustic wave resonators is 10 to 30 times the wavelength of a surface acoustic wave.

In accordance with another aspect of the present invention, there is provided a method (hereunder sometimes referred to as a first method) for designing a surface acoustic wave device having first and second surface acoustic wave resonators placed on a piezoelectric plate in such a way as to be proximate to one another. In this device, each of the first and second surface acoustic wave resonators consists of at least one interdigital transducer and at least one pair of reflectors. Further, each of the surface acoustic wave resonators are adapted to have different frequency-temperature characteristics. Moreover, the transverse elastic coupling of the surface acoustic wave resonators is performed in such a way that the plurality of surface acoustic wave resonators compose a single coupling resonator. This method comprises: a first step of determining a resonance frequency f of the surface acoustic wave device; a second step of determining the film thicknesses of the interdigital transducers in such a way that the peak temperatures of the first and second surface acoustic wave resonators are different from one another; a third step of finding a difference Δ between a first resonance frequency, which is obtained at the peak temperature of the first surface acoustic resonator, and a second resonance frequency, which is obtained at a peak temperature of the second surface acoustic resonator, according to the film thicknesses; and a fourth step of setting an electrode pitch P of the first surface acoustic wave resonator and an electrode pitch P of the second surface acoustic wave resonator in such a manner as to cancel the difference Δ between the first resonance frequency and the second resonance frequency.

In accordance with still another aspect of the present invention, there is provided a method (hereunder sometimes referred to as a second method) for designing a surface acoustic wave device having first and second surface acoustic wave resonators placed on a piezoelectric plate in such a way as to be proximate to one another. In this device, each of the first and second surface acoustic wave resonators consists of at least one interdigital transducer and at least one pair of reflectors. Further, each of the surface acoustic wave resonators are adapted to have different frequency-temperature characteristics. Moreover, the transverse elastic coupling of the surface acoustic wave resonators is performed in such a way that the plurality of surface acoustic wave resonators compose a single coupling resonator. This method comprises: a first step of determining a resonance frequency f of the surface acoustic wave device; a second step of determining the line widths of fingers of the interdigital transducers in such a way that the peak temperatures of the first and second surface acoustic wave resonators are different from one another; a third step of finding a difference Δ between a first resonance frequency, which is obtained at the peak temperature of the first surface acoustic resonator, and a second resonance frequency, which is obtained at the peak temperature of the second surface acoustic resonator, according to the film thicknesses; and a fourth step of setting an electrode pitch P of the first surface acoustic wave resonator and an electrode pitch P of the second surface acoustic wave resonator in such a manner as to cancel the difference Δ between the first resonance frequency and the second resonance frequency.

In the case of an embodiment of the first or second method, in the fourth step, the electrode pitch P is set according to the following equation:

$$p = Vs / \{2(f \pm \Delta/2)\}$$

where Vs designates the velocity of surface acoustic wave; f the resonance frequency; and Δ the difference between the first resonance frequency and the second resonance frequency.

BRIEF DESCRIPTION OF THE DRAWINGS

Other features, objects and advantages of the present invention will become apparent from the following description of preferred embodiments with reference to the drawings in which like reference characters designate like or corresponding parts throughout several views, and in which.

DETAILED DESCRIPTION OF THE PREFERRED EMBODIMENTS

Embodiment 1

Hereinafter, the "Embodiment 1" of the present invention will be described by referring to the accompanying drawings from FIG. 1 in due order. A device according to "Embodiment 1" of the present invention is what is called a K-cut element.

Figure 1:
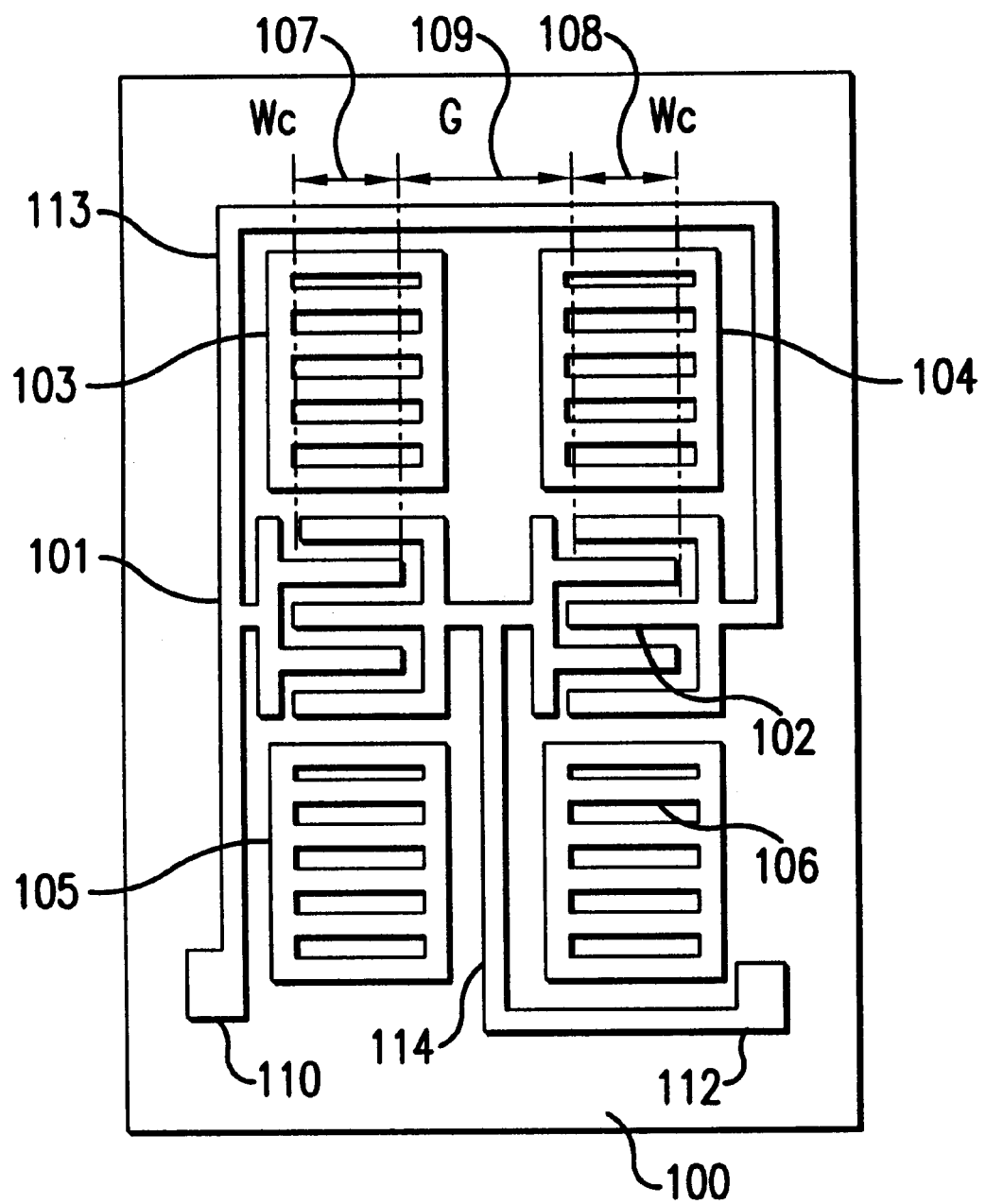
FIG. 1 is a plan view of a surface acoustic wave device according to "Embodiment 1" and "Embodiment 2" of the present invention.

FIG. 1 is a plan view of the interconnecting pattern of transverse-elastic-coupling one-port SAW devices which are an embodiment of a surface acoustic wave device of the present invention. The names of parts shown in this figure are as follows. Reference number 100 designates a piezoelectric plate; 101 and 102 interdigital transducers (hereunder sometimes abbreviated as IDTs); 103, 104, 105 and 106 reflectors; 107 and 108 finger overlap widths Wc; 109 the distance between SAW resonators G; 110 and 112 pads for wire-bonding; and 113 and 114 conductive pattern for connection.

The piezoelectric plate 100 consists of a single piezoelectric crystal of, for example, quartz or lithium tantalate (LiTaO$_3$) and a substrate on which a piezoelectric thin film made of ZnO or the like is formed. The IDTs 101 and 102 and the reflectors 103, 104, 105 and 106 are made on the piezoelectric plate 100 by forming a conductive thin film, which is made of conductive metal such as aluminum or gold, through an evaporation or a sputtering, and thereafter forming the pattern thereof by utilizing photolithography techniques.

A first one-port SAW resonator is constituted by the reflectors 103 and 105 and the IDT 101. Further, a second SAW resonator is constituted by the reflectors 104 and 106 and the IDT 102. A large number of fingers (namely, electrodes) and conductive strips of the IDTs and the reflectors are placed in such a way as to be orthogonal to a phase advance direction of a utilized surface acoustic wave (for instance, a Rayleigh wave and a leaky wave) and to be in parallel to one another and periodic. The first and second SAW resonators are adapted to have displacements which are elastically coupled to each other in an oblique symmetry mode.

Next, transverse-elastic-coupling two-port SAW resonators, which are another example of "Embodiment 1" of the present invention, will be described hereinbelow by referring to FIG. 2. In this figure, reference number 200 designates a piezoelectric plate; 201, 202, 205 and 206 reflectors; 203, 204, 207 and 208 IDTs; 209, 210, 211, 212, 213 and 214 electrode pads for wire-bonding; 215 and 216 input terminals 1 and 1'; and 217 and 218 output terminals 2 and 2'.

Figure 2:
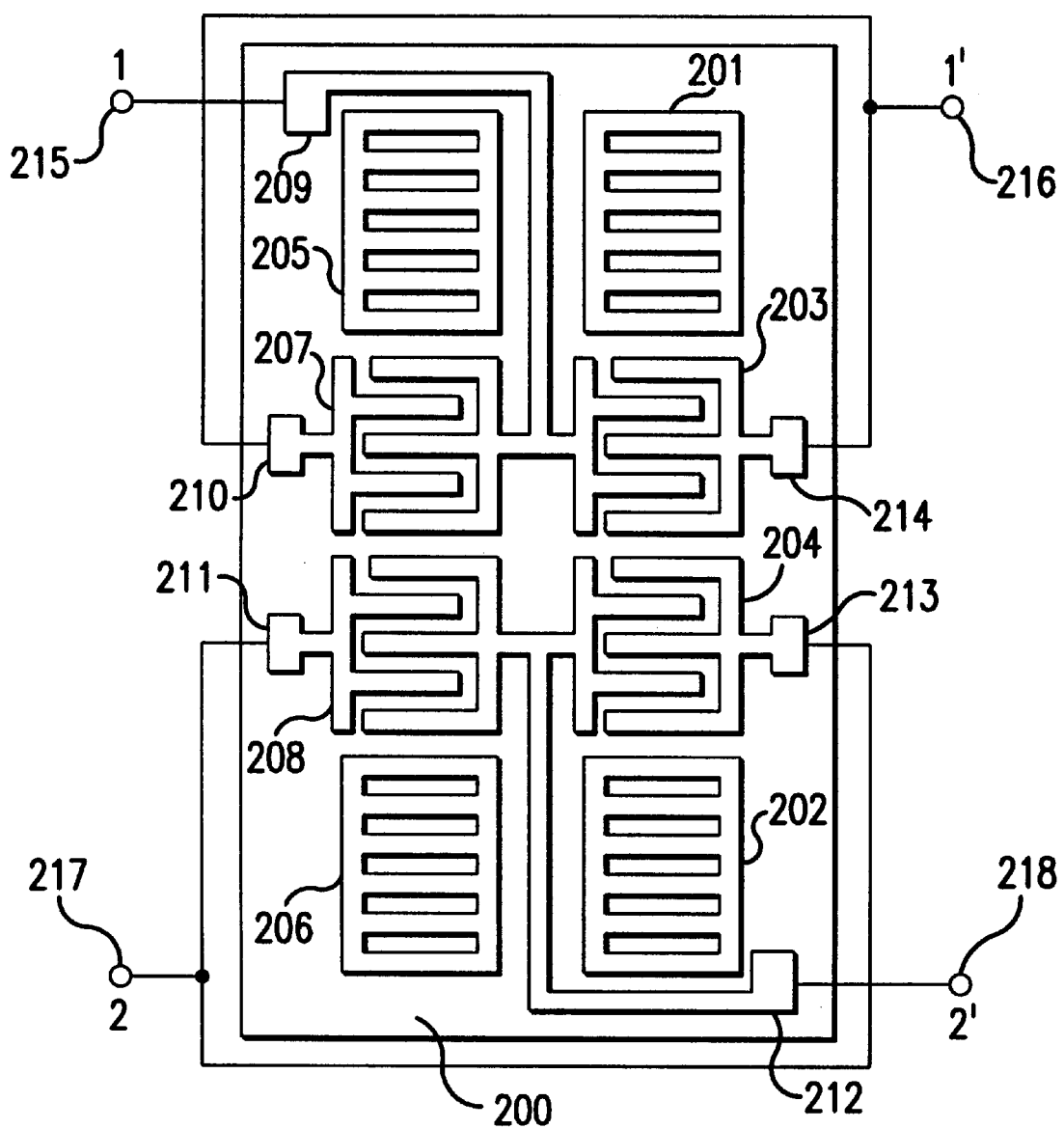
FIG. 2 is a plan view of another surface acoustic wave device according to "Embodiment 1" and "Embodiment 2" of the present invention.

As shown in FIG. 2, a first two-port SAW resonator is constituted by the reflectors 205 and 206 and the IDTs 207 and 208. A second two-port SAW resonator is constituted by the reflectors 201 and 202 and the IDTs 203 and 204. The first and second two-port SAW resonators are adapted to have displacements which are elastically coupled to each other in the direction of the width thereof in an oblique symmetry mode.

In the case of the surface acoustic wave device according to "Embodiment 1" of the present invention, the one-port SAW resonators consisting of one IDT and a pair of reflectors, the two-port SAW resonators consisting of a plurality of IDTs or a transversal-type SAW filter using only two IDTs may be employed as first and second composing elements thereof.

Figure 3:
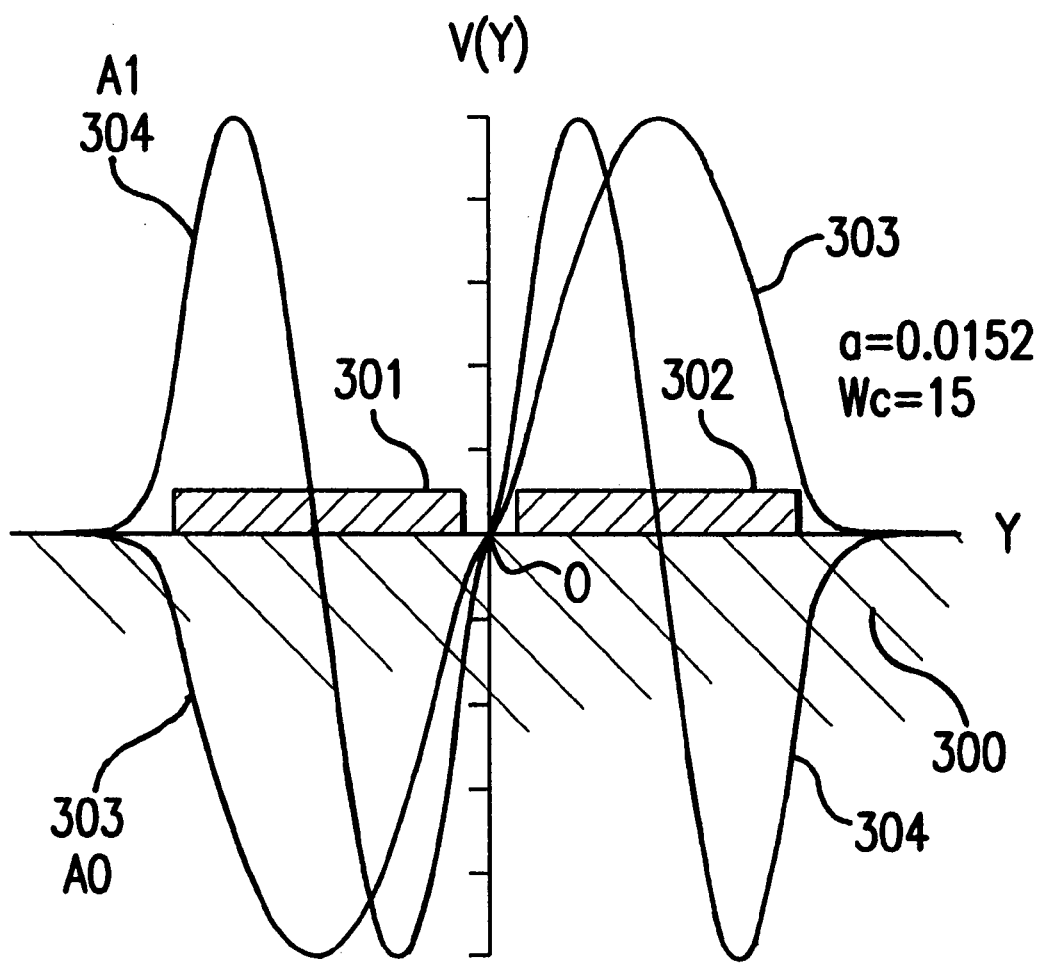
FIG. 3 is a graph for illustrating the vibrational displacement of a surface acoustic wave device of "Embodiment 1" and "Embodiment 2" of the present invention.

FIG. 3 shows the amplitudes of the vibrational displacements in the transverse direction or in the direction of width (the Y-direction), which are exhibited by the surface acoustic wave devices of FIGS. 1 and 2. In FIG. 3, reference number 300 denotes a piezoelectric plate; 301 and 302 IDTs (transverse sections of SAW resonators); 303 a fundamental wave oblique symmetry mode A0; and 304 a first order oblique symmetry mode A1. It is characteristic of both of the amplitudes of the vibrational displacements in the oblique symmetry modes 303 and 304 to be nearly symmetric with respect to the central point O between the two SAW resonators. In the case of the embodiment of the present invention, it is preferable that the fundamental oblique symmetry mode A0 is used.

Figure 4:
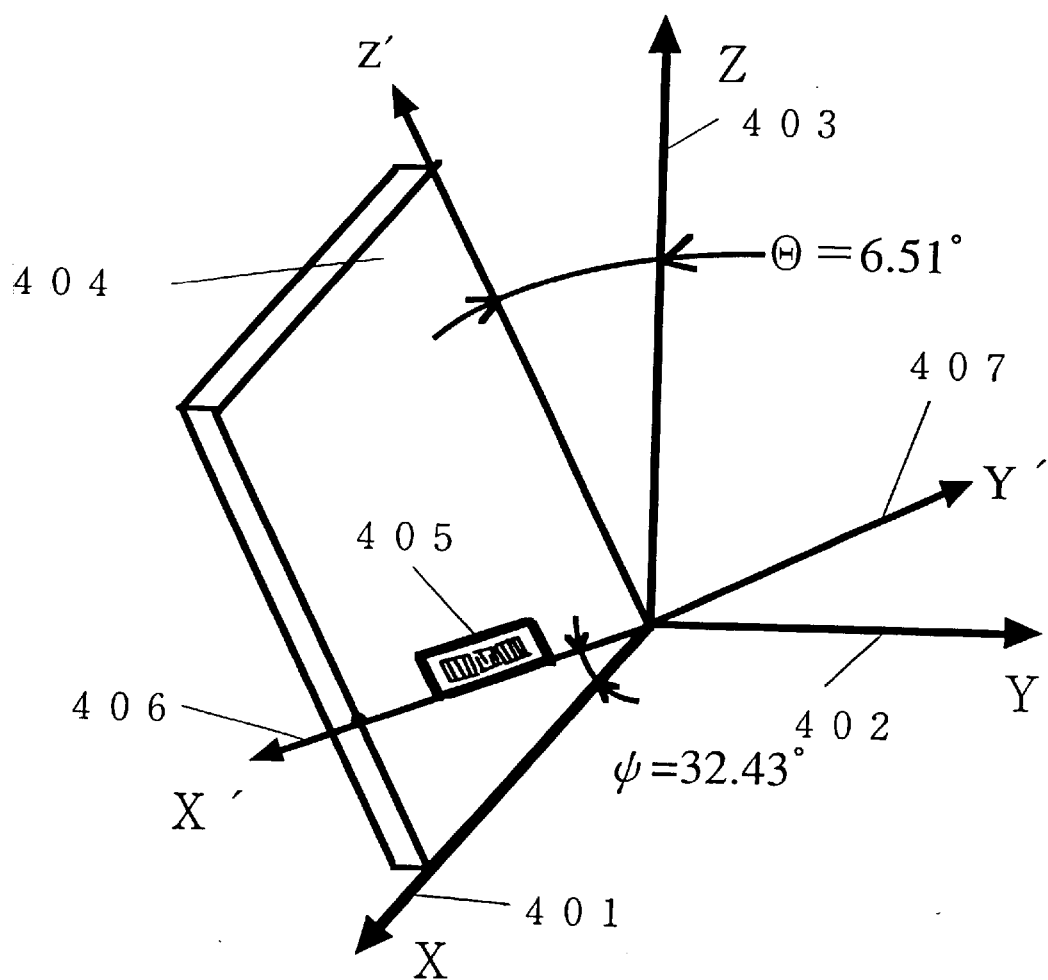
FIG. 4 is a diagram for illustrating a cutting direction employed in the case of a K-cut quartz crystal plate used in a surface acoustic wave device of "Embodiment 1" of the present invention.

Next, the case of a SAW device employing a quartz crystal K-cut element will be described hereunder as a more practical example of application of the embodiment of the present invention. FIG. 4 is a diagram for illustrating a cutting direction employed in the case of a quartz crystal K-cut element used in the SAW device according to this embodiment of the present invention. In this figure, reference number 401 denotes an electrical axis of the crystal; 402 a mechanical axis thereof; and 403 an optical axis thereof. These axes compose a right-hand orthogonal coordinate system. Further, reference number 404 denotes a quartz crystal plate that is obtained by rotating a Y-cut plane, which is perpendicular to the Y-axis, 402, around the electrical axis 401 counterclockwise by an angle θ of 6.51±1 degrees. In the case of a surface acoustic wave element 405, a cutting direction is set in such a manner that the phase propagation (or advance) direction of a surface acoustic wave is in agreement with the direction of X'-axis 406 obtained by rotating the electrical axis 401 of the quartz crystal plate around Y'-axis 407 by an angle ψ of 32.43±2 degrees.

Figure 5:
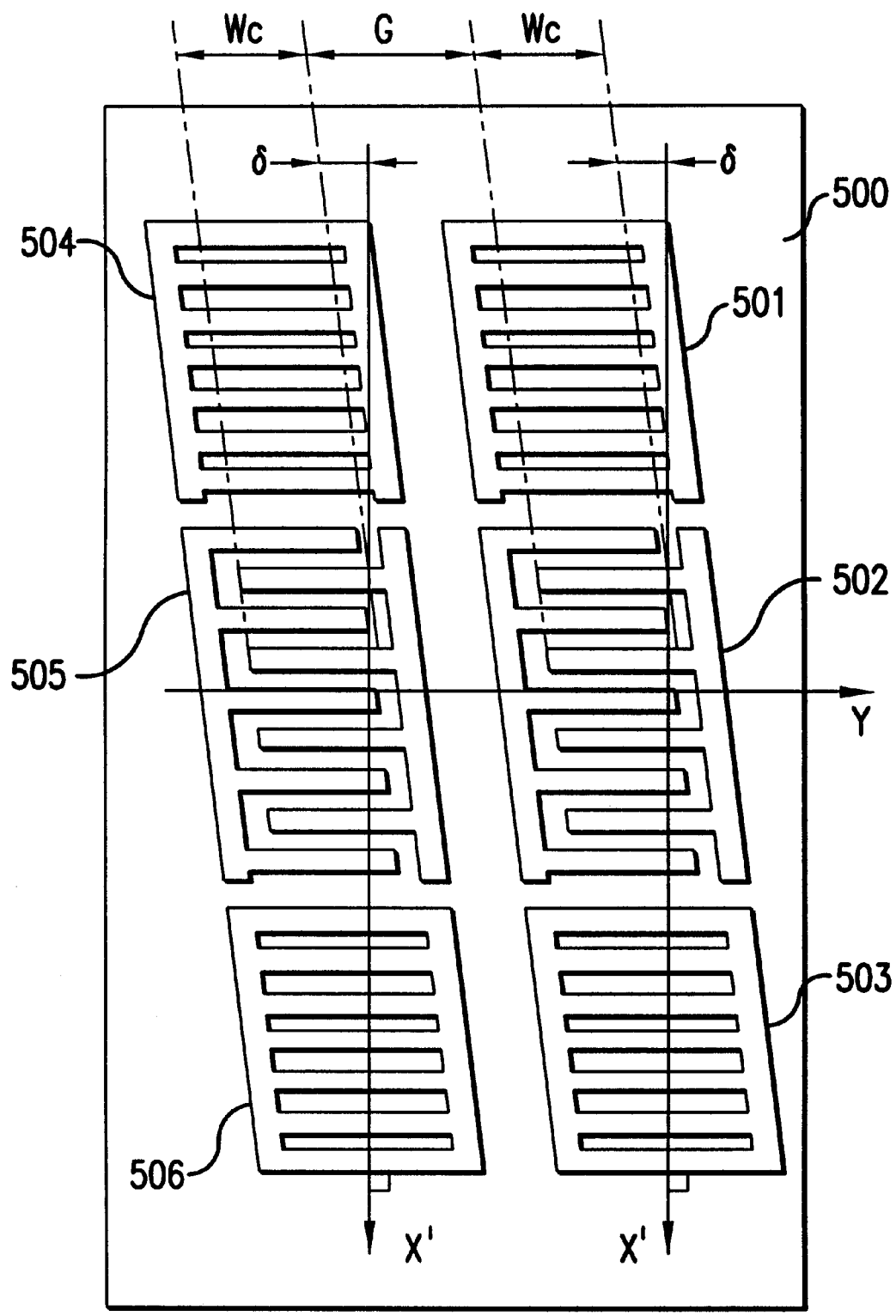
FIG. 5 is a plan view of a surface acoustic wave device using a K-cut crystal plate of "Embodiment 1" of the present invention.

FIG. 5 is a conceptual diagram showing an electrode pattern formed on the surface of a K-cut element obtained by setting the cutting direction as illustrated in FIG. 4 on the surface of a piezoelectric plate 500. In FIG. 5, reference numbers 501, 503, 504 and 506 designate reflectors; and 502 and 505 IDTs. The elements of this figure constitute transverse-elastic-coupling one-port SAW resonators. In this figure, reference character Wc denotes a finger overlap width of each IDT; and G the distance between the resonators. Both the first resonator consisting of the elements 501, 502 and 503, and the second resonator consisting of the elements 504, 505 and 506 is configured in such a manner that a direction, in which the resonator is formed, is inclined at an angle δ of 3±2 degrees to the phase propagation direction of the surface acoustic wave (the direction of the X'-axis of FIG. 4). Thereby, the direction in which the power or energy of the surface acoustic wave propagates can be the same as the direction in which a region of the resonator is formed. Consequently, the Q-factor of the resonator can be enhanced. In FIG. 5, the Y-axis is set in such a way as to be orthogonal to the X'-axis, the direction of which is the aforementioned phase propagation direction of the surface acoustic wave.

Next, the configurations of the IDTs for exciting the oblique symmetry modes A0 and A1 will be described by referring to FIGS. 6 and 7.

Figure 6:
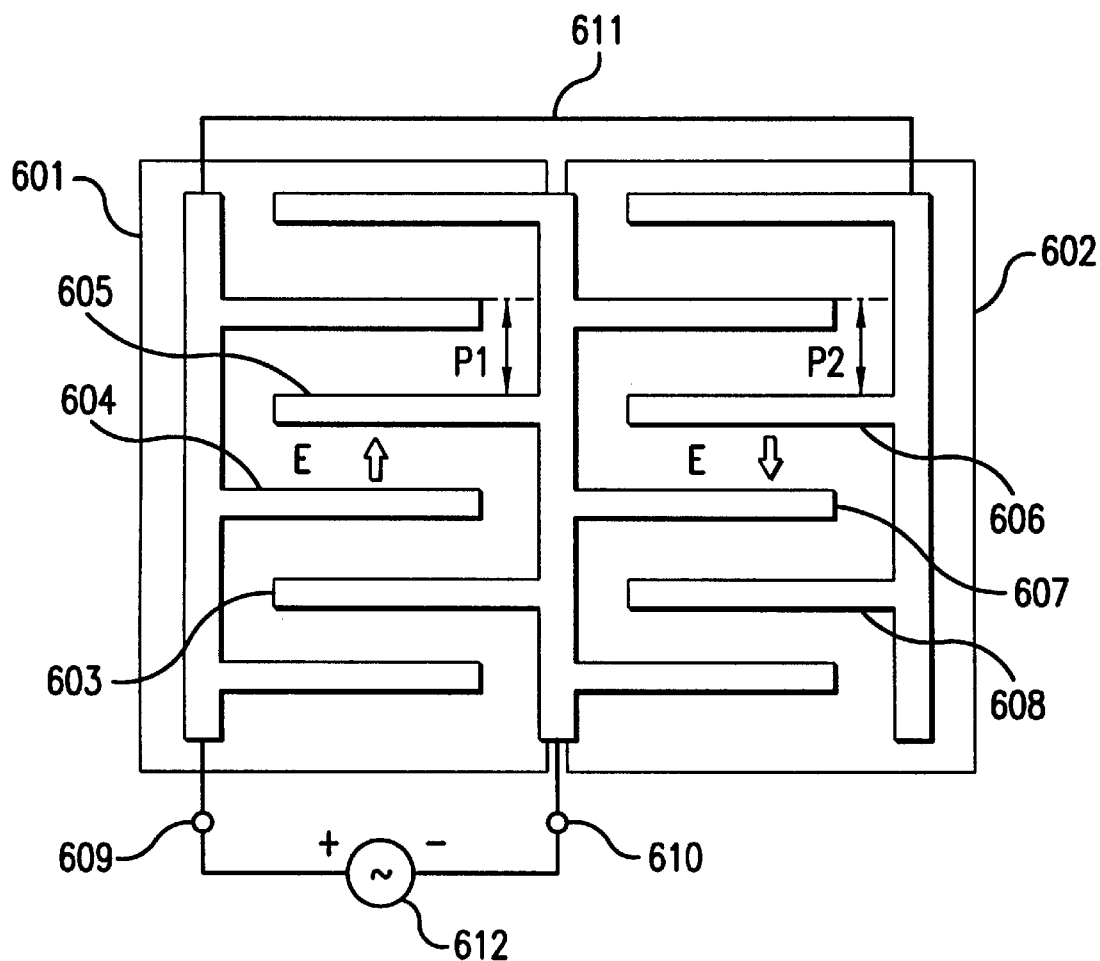
FIG. 6 is a diagram for illustrating the electrode pattern of interdigital transducers (hereunder sometimes abbreviated as IDT) of the parallel type used in a surface acoustic wave device of "Embodiment 1" and "Embodiment 2" of the present invention.
Figure 7:
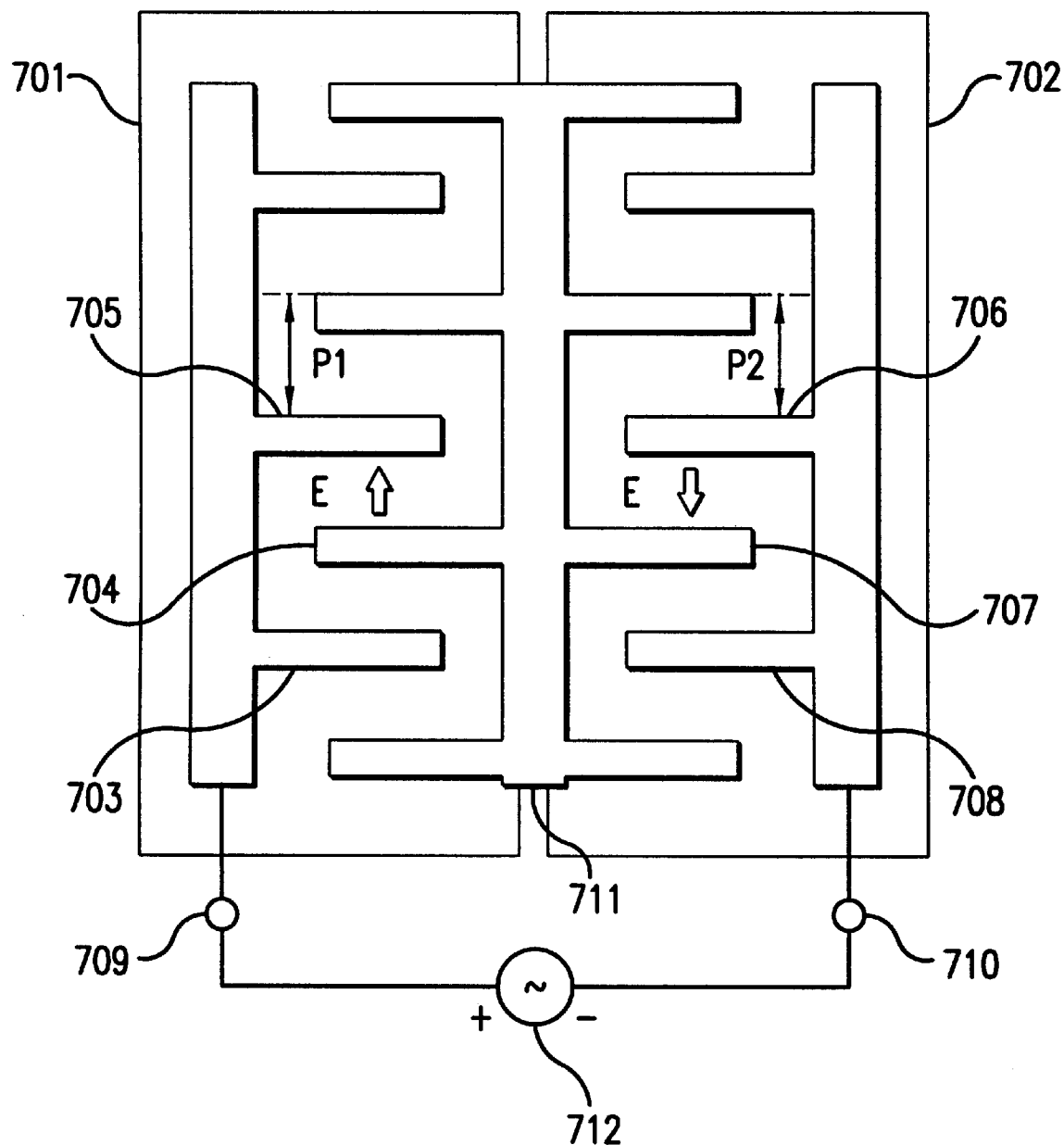
FIG. 7 is a diagram for illustrating the electrode pattern of IDTs of the series type used in a surface acoustic wave device of "Embodiment 1" and "Embodiment 2" of the present invention.

FIG. 6 illustrates the placement of the electrodes of the IDTs of the parallel-connected type for performing the excitation. In this figure, reference number 601 designates the IDT of the first resonator; 602 the IDT of the second resonator; 603 to 608 electrode fingers (electrodes); 609 a positive-electrode signal input terminal; 610 a negative-electrode signal input terminal; 611 a conductor or conductive wire for connecting the positive electrodes of the first and second IDTs with each other; and 612 a signal source. In this figure, arrows denote vectors indicating the excited electric fields. It is very important that in this case, the direction of the electric field produced by the fingers 604 and 605 is opposite to the direction of the electric field produced by the fingers 606 and 607, wherein the fingers 604 and 605 and the fingers 606 and 607 are positioned nearly in the same place in the longitudinal direction of the resonators.

Thereby, the electric field of the fundamental oblique symmetry mode A0 is excited.

Next, the configuration of the electrode finger pattern for exciting the oblique symmetry mode in the case of connecting the first and second IDTs in series with each other will be described hereinbelow by referring to FIG. 7. In this figure, reference number 701 designates a first IDT; 702 a second IDT; 703, 704, 705, 706, 707 and 708 electrode fingers; 709 a positive-electrode signal input terminal; 710 a negative-electrode signal input terminal; and 712 a signal source. In this case, the adjoining fingers of the two resonators are connected with one another through a common conductor 711. Further, in this case, the corresponding fingers possessed by the first and second IDTs are positioned nearly in the same place in the longitudinal direction of the resonators.

In the case of the IDTs of the parallel-connected type, the impedance of the aforementioned transverse-elastic-coupling resonator is small. In contrast, in the case of the IDTs of the series-connected type, the impedance thereof is large, while the electrode pattern is simple.

Next, the frequency-temperature characteristics of various surface acoustic wave devices realized by the aforementioned "Embodiment 1" of the present invention will be described.

Figure 8:
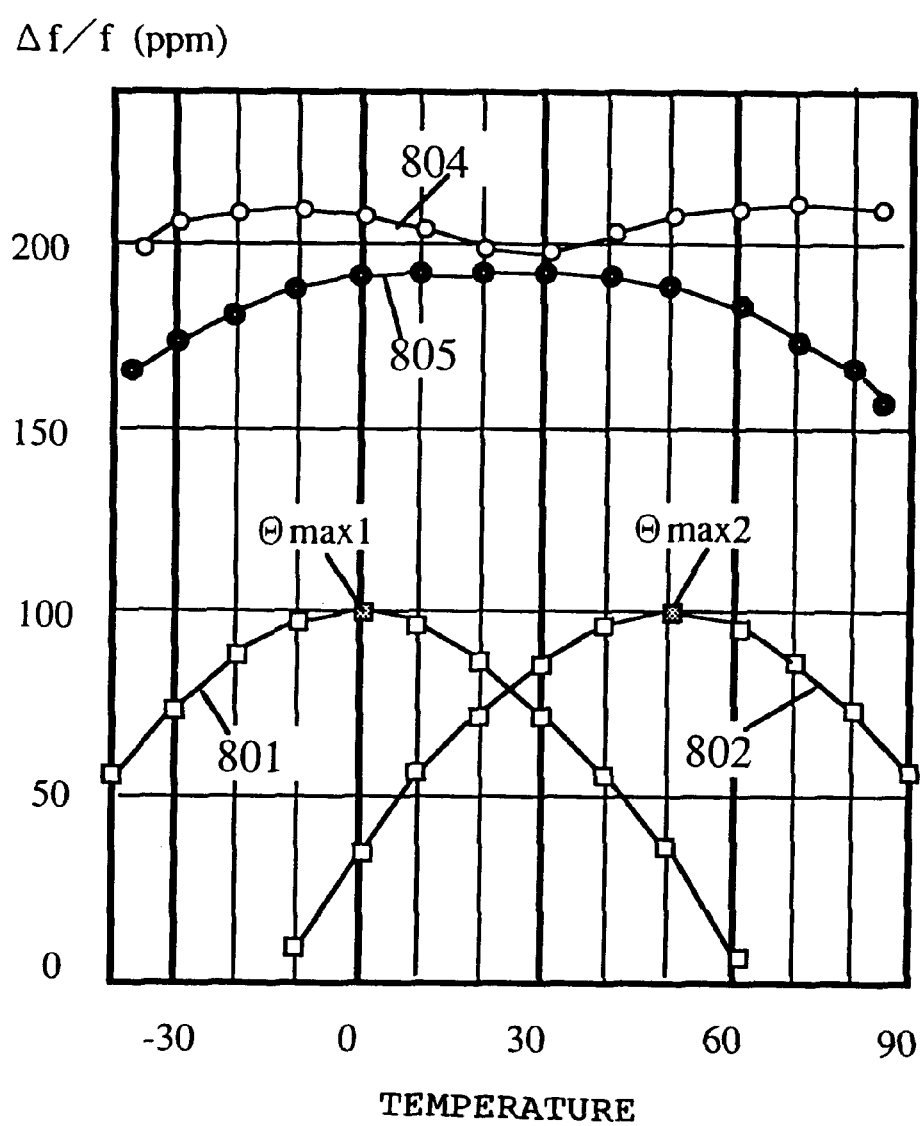
FIG. 8 is a graph for illustrating the frequency-temperature characteristics of a surface acoustic wave device according to "Embodiment 1" of the present invention.

FIG. 8 illustrates the frequency-temperature characteristics of the embodiments of FIGS. 1 and 2. In FIG. 8, the horizontal axis represents an ambient temperature T (° C.); the vertical axis the rate of change in frequency Δf/f (in ppm). Further, reference numbers 801 and 802 designate upward-convex nearly-quadratic-function curves which respectively represent the frequency-temperature characteristics of the first and second resonators in the case that there is no elastic coupling. The curve 801 has a peak temperature $\theta_{max1}$. Further, the curve 802 has a peak temperature $\theta_{max2}$. The frequency-temperature characteristics 801 and 802 are represented by the following function:

$$\Delta f/f = \beta(\theta - \theta_{max})^2 + \gamma(\theta - \theta_{max})^3 \quad (1)$$

where $\theta$ designates a temperature; $\beta$ a second order temperature coefficient; $\gamma$ a third order temperature coefficient. In the case of "Embodiment 1" of the present invention, the term associated with $\gamma$ is often negligibly small.

Curves 804 and 805 represent the frequency-temperature characteristics of the first and second resonators coupled to each other in the fundamental oblique symmetry mode A). The difference between the shapes of the curves 804 and 805 varies with the combination of the frequency-temperature characteristics of the first and second resonators $\Delta\theta = \theta_{max2} - \theta_{max1}$ and depends upon the distance G between the resonators and the width Wc of each of the resonators. The curve 804 corresponds to the case where the elastic coupling is weak. In contrast, the curve 805 corresponds to the case where the elastic coupling is strong. The optimum combination of conditions for making the frequency-temperature characteristics of the resonators, which are in the coupled state, flat depends on the material of the piezoelectric plate and the cutting direction. This is due to the difference in magnitude of effective shear stiffness constant a between the resonators, which determines the degree of the elastic coupling therebetween, and to the difference in frequency-temperature characteristics therebetween, which is present when a single resonator is composed. In the case of the quartz crystal K-cut element, the constant a ranges from about 0.01 to 0.02 under normal design conditions. Further, the constant a is a parameter contained in the following differential equation which prescribes the displacement of the resonator in the transverse-mode such as an oblique symmetry mode and a symmetry mode.

$$a\omega_0^2(\partial^2 V(Y)/\partial Y^2) + (\omega^2 - \omega_0^2)V(Y) = 0 \quad (2)$$

where $\omega$ designates an angular frequency (rad/s); $\omega_0$ an element angular frequency (rad/s) of a concerned region; V(Y) an amplitude of a surface acoustic wave displacement in the direction of width; Y a Y-coordinate of the surface acoustic wave device, which is normalized in terms of the wavelength of a surface acoustic wave, as illustrated in FIG. 3. The derivation of this equation and the aforementioned conditions will be described later in detail.

Moreover, it is preferable for optimizing the frequency-temperature characteristics that the finger overlap width Wc of the resonator is 10 to 30 times the wavelength of the surface acoustic wave, that the distance G between the resonators is 1 to 5 times the wavelength of the surface acoustic wave and that the difference $\Delta\theta$ between the peak temperature of the frequency-temperature characteristics is in a range of 30 to 80° C. Thereby, in the temperature range between −30 to 90° C., the frequency accuracy can be 20 ppm at best and 70 ppm at worst. When such best frequency accuracy is realized, the difference $\Delta\theta$ is 70° C. and the peak temperatures $\theta_{max1} = -10°$ C. and $\theta_{max2} = 60°$ C. Meanwhile, in the case of the temperature characteristics of the single K-cut resonator, the second order temperature coefficient $\beta = -2.5 \times 10^{-8}/°C^2$. Thus, in the temperature range between −30 to 90° C., the frequency accuracy is −90 ppm. Therefore, the frequency accuracy can be improved by a factor of 4.5. Furthermore, at the central temperature of the operating temperature range, 30±30° C., the rate of change in frequency Δf/f can be within ±3 ppm (at that time, $\Delta\theta = 50°$ C.) by suitably combining the ranges of the aforementioned parameters with each other.

Figure 9:
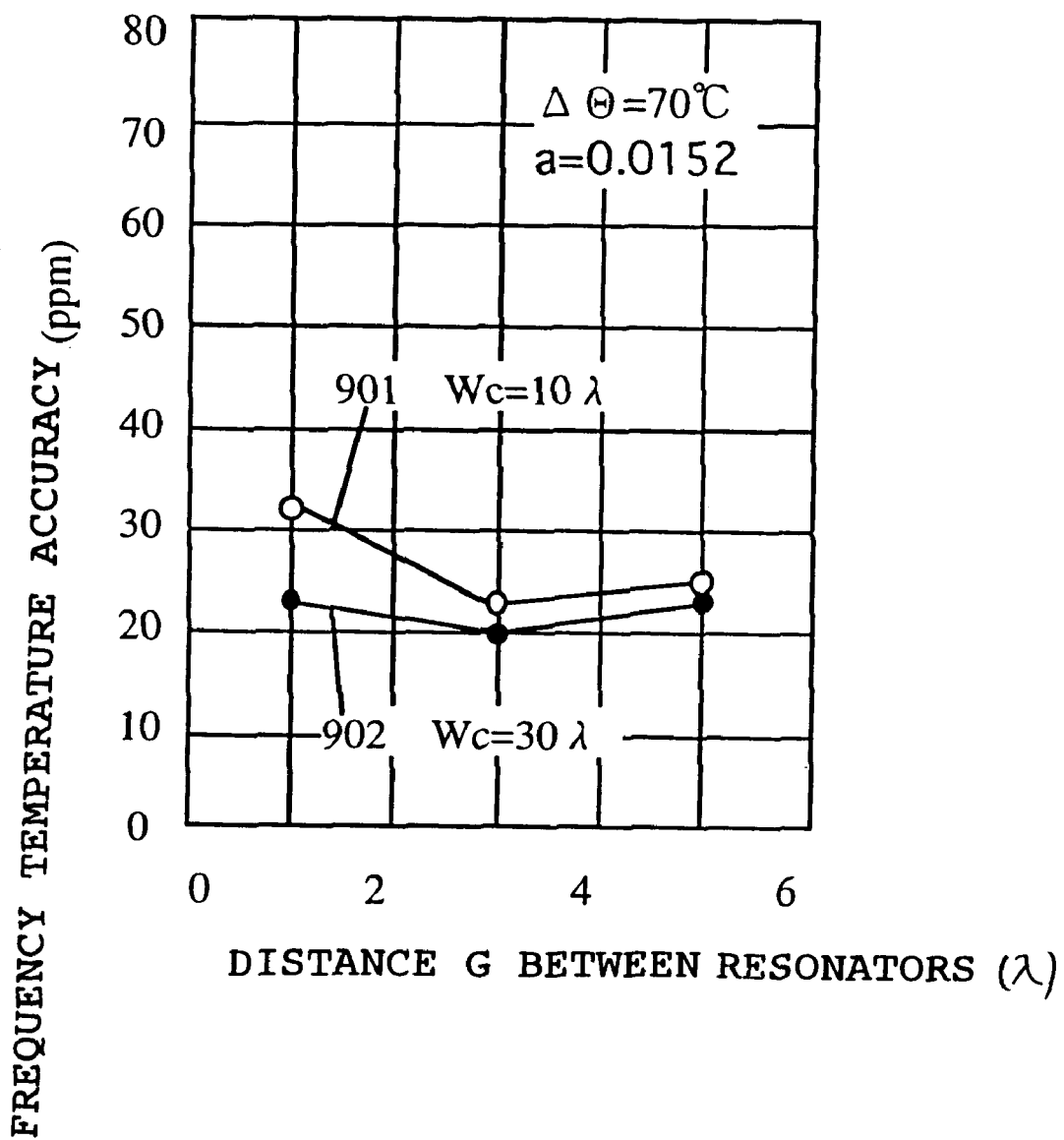
FIG. 9 is a graph for illustrating the frequency temperature accuracy characteristic of a surface acoustic wave device as a function of distance between resonators according to "Embodiment 1" of the present invention.
Figure 10:
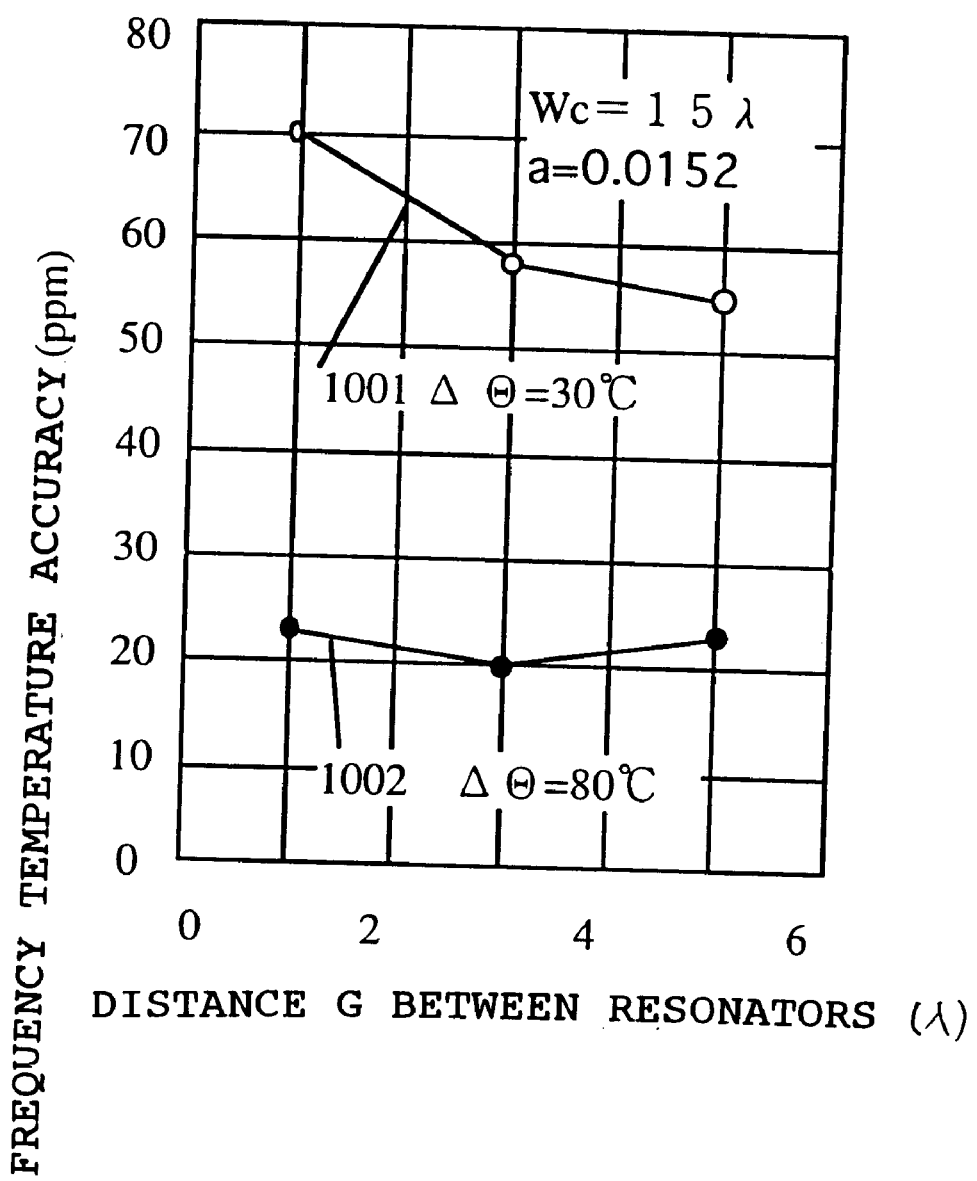
FIG. 10 is a graph for illustrating the frequency temperature accuracy characteristic of a surface acoustic wave device as a function of distance between resonators according to "Embodiment 1" of the present invention.
Figure 13:
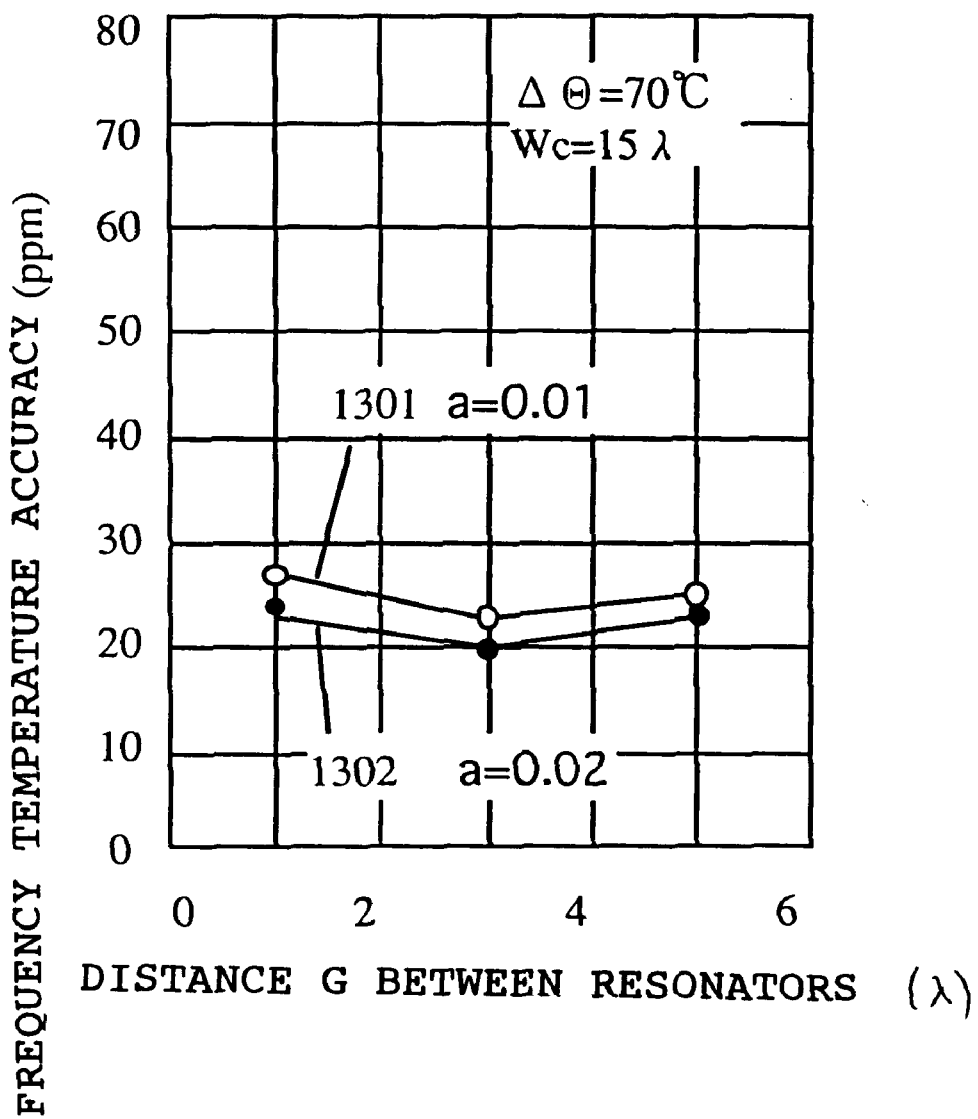
FIG. 13 is a graph for illustrating the frequency temperature accuracy characteristic of a surface acoustic wave device as a function of distance between resonators according to "Embodiment 1" of the present invention.
Figure 14:
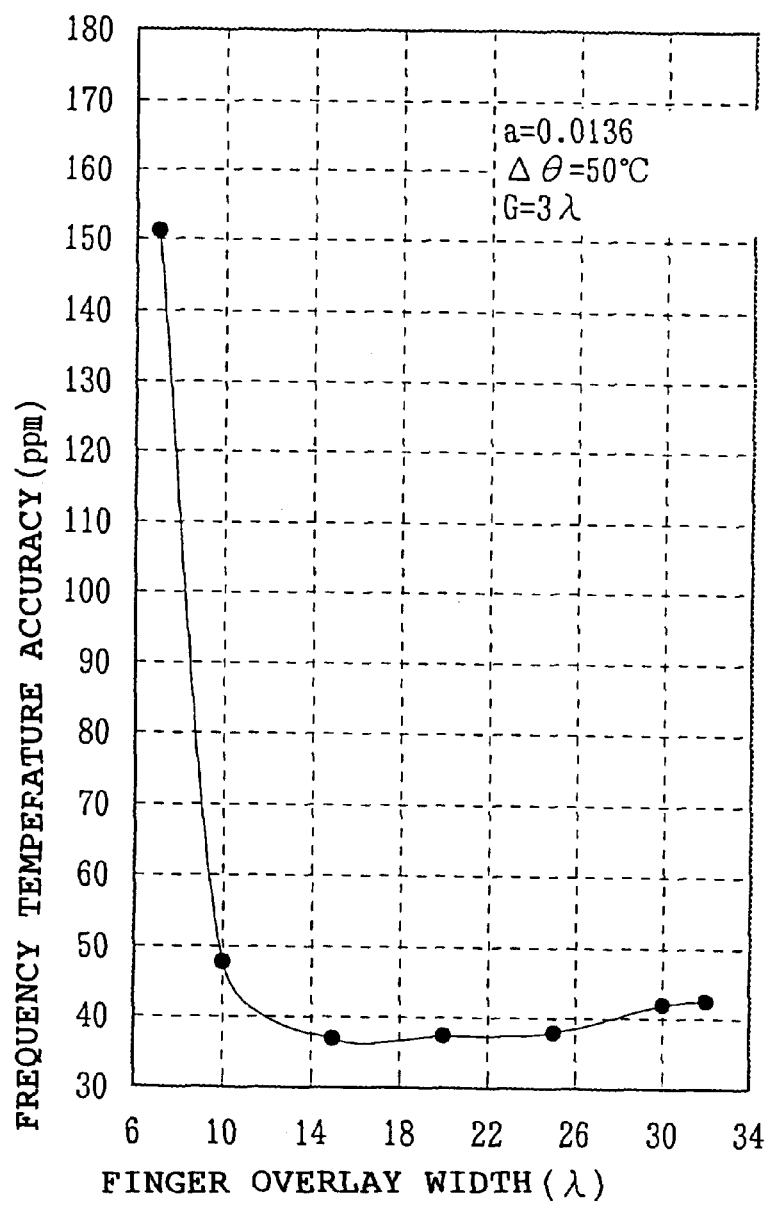
FIG. 14 is a graph for illustrating the frequency temperature accuracy characteristic of a surface acoustic wave device as a function of finger overlay width according to "Embodiment 1" of the present invention.

The hereinabove-mentioned characteristics of the frequency temperature accuracy at the time of coupling the resonators (namely, the change in frequency in the temperature range of −30 to 90° C.) is illustrated in FIGS. 9, 10 and 13, in each of which the abscissa represents the distance G between the resonators and among which the parameters Wc, $\Delta\theta$ and a are changed. In FIG. 9, lines 901 and 902 represent the cases where the overlap width Wc of the resonator is 10 times and 30 times the wavelength of the surface acoustic wave, respectively. In FIG. 10, lines 1001 and 1002 represent the cases where the difference $\Delta\theta$ between the peak temperature of the frequency-temperature characteristics is 30° C. and 80° C., respectively. In FIG. 13, lines 1301 and 1302 represent the cases where the constant a is 0.01 and 0.02, respectively. Further, the frequency temperature accuracy at the time of coupling the resonators is illustrated in FIG. 14 in which the abscissa represents the finger overlap width Wc of the resonator and in which the parameters G, $\Delta\theta$ and a are changed.

Figure 11:
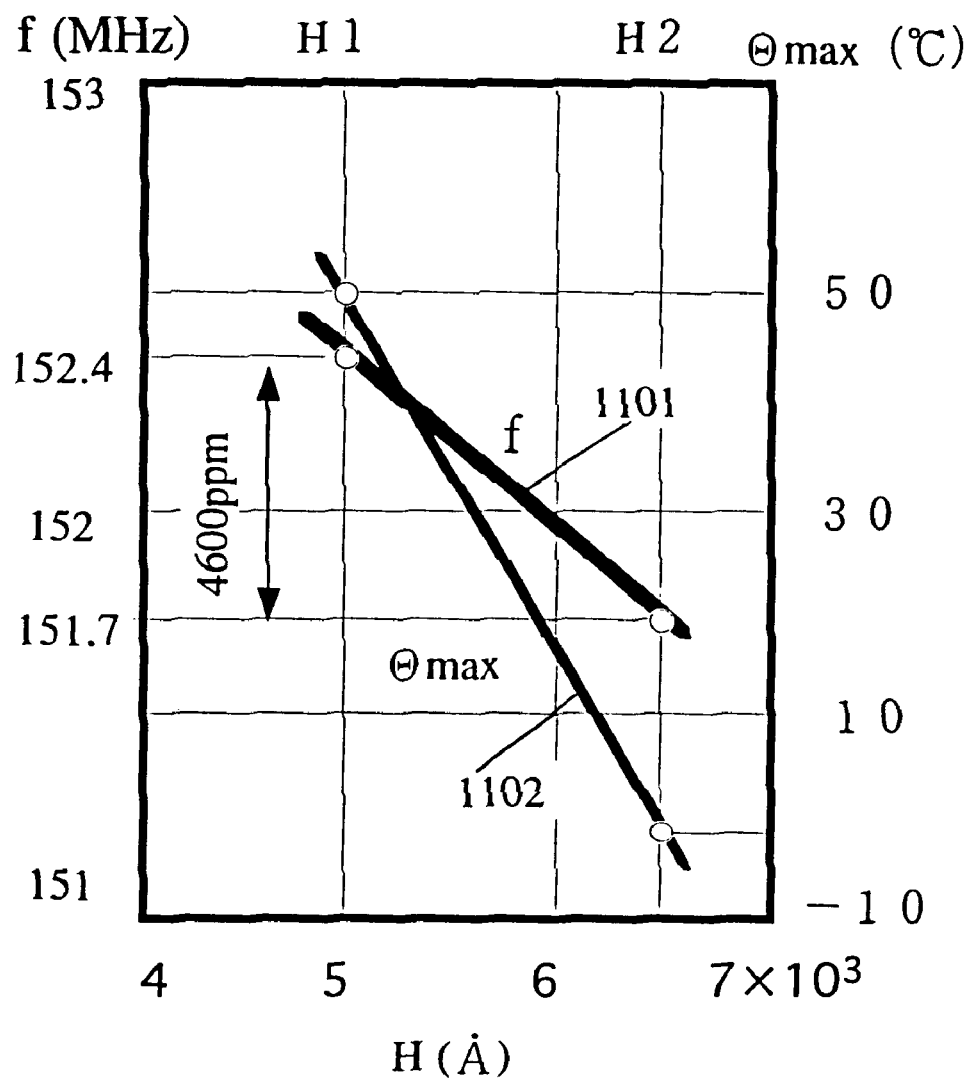
FIG. 11 is a graph for illustrating a film thickness characteristic of a surface acoustic wave device according to "Embodiment 1" of the present invention.

Next, a practical method of designing the surface acoustic wave device according to "Embodiment 1" of the present invention will be described hereinbelow by referring to FIGS. 11 and 12. When designing the surface acoustic wave device, it is necessary to make the frequencies, which respectively correspond to the peak temperatures $\theta_{max1}$ and $\theta_{max2}$ of the first and second surface acoustic wave elements (resonators or the like), as close to each other as possible. A method for realizing such conditions is illustrated in FIG. 11. In this figure, the abscissa represents the thickness H of the electrode of the surface acoustic wave element. Further, the left-hand ordinate represents the frequency, and the right-hand ordinate represents the peak temperature $\theta_{max}$. Moreover, a line 1101 represents the frequency-change characteristics, and another line 1102 designates the characteristics of change in peak temperature $\theta_{max}$. For example, in the case of designing the one-port resonator of FIG. 1 having the resonance frequency of 152.05 MHz, the electrode thickness H1 of the first resonator and the electrode thickness H2 of the second resonator are set at 5000 Å and 6500 Å, respectively, so that the peak temperatures of the two resonators are made to be different from each other. Thus, the difference $\Delta\theta$ between the peak temperatures is set at about 55° C. The frequencies of the resonators change as indicated by line 1101, so that the frequencies thereof respectively corresponding to the electrode thicknesses become 152.400 MHz and 151.7 MHz. This results in the frequency difference Δ=4600 ppm. To eliminate this frequency difference, the electrode pitches P of the resonators (see FIGS. 6 and 7) are set as follows. Namely, the electrode pitch P1 corresponding to the first resonator is set according to the following equation:

$$P1=Vs/\{2(f-\Delta/2)\} \quad (3)$$

Further, the electrode pitch P2 corresponding to the second resonator is set according to the following equation:

$$P2=Vs/\{2(f+\Delta/2)\} \quad (4)$$

In these equations, Vs designates the velocity of the surface acoustic wave. Thereby, it is obvious that the frequencies of the first and second resonators are in agreement with each other. This is because the frequency f of the resonator is determined according to the following equation:

$$f=Vs/2P.$$

Figure 12:
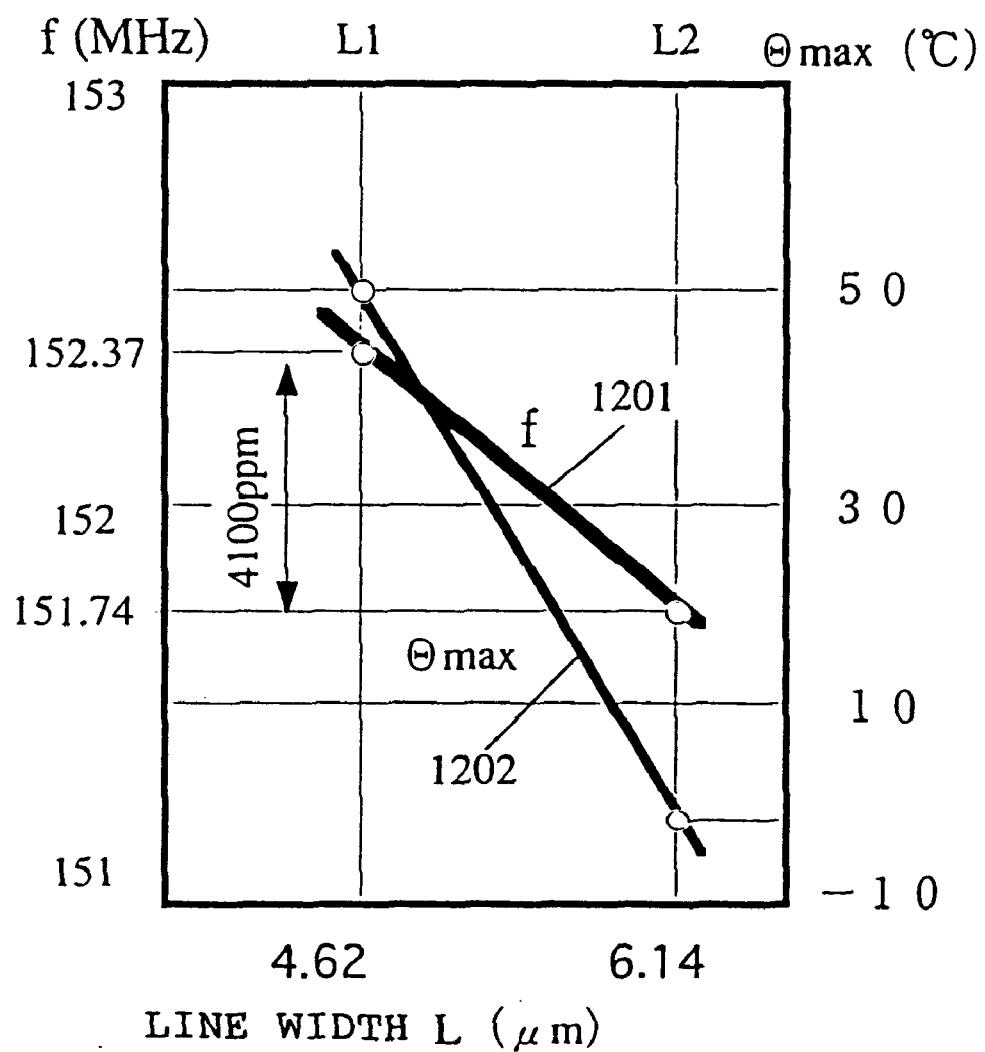
FIG. 12 is a graph for illustrating a line width characteristic of a surface acoustic wave device according to "Embodiment 1" of the present invention.

Moreover, another method for designing the surface acoustic wave device is illustrated in FIG. 12. In the case of this example, the designed frequency of the surface acoustic wave device is set at 152.055 MHz. In this figure, the abscissa represents the line width L of each of the surface acoustic wave fingers. Furthermore, the left-hand ordinate and the right-hand ordinate represent the resonance frequency f and the peak temperature $\theta_{max}$, respectively. Further, a curve 1201 represents the frequency characteristics of the resonators, and another curve 1202 represents the characteristics of the peak temperatures $\theta_{max}$. The peak temperatures $\theta_{max}$ corresponding to the line widths L1=4.620 μm and L2=6.140 μm are about 50° C. and −5° C., respectively. Moreover, the frequencies corresponding to these line widths are 152.370 MHz and 151.740 MHz, respectively. Consequently, the frequency difference Δ is about 4100 ppm. This frequency difference can be eliminated by setting and correcting the electrode pitches P of the surface acoustic wave devices according to the equations (3) and (4) similarly as in the case of FIG. 11.

Embodiment 2

"Embodiment 2" of the present invention will be described hereinafter by referring to the accompanying drawings. A device according to "Embodiment 2" of the present invention is what is called an ST-cut element. In the following description, FIGS. 1, 2, 6 and 7 and the equations (1) to (4), which have been referred to in the foregoing description of "Embodiment 1" of the present invention, will be referred to again in addition to FIGS. 15 to 23.

Figure 15:
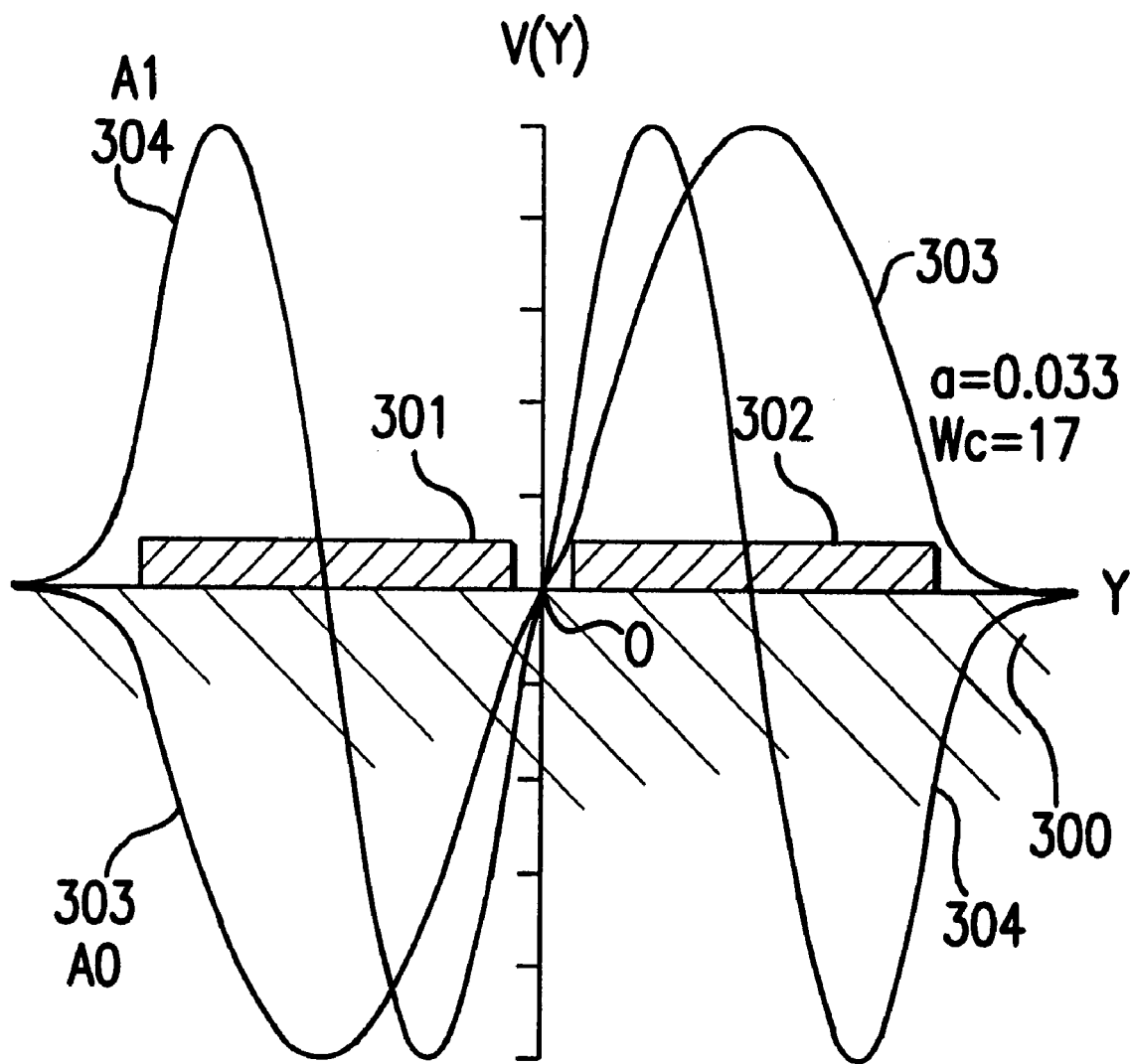
FIG. 15 is a graph for illustrating the vibrational displacement of a surface acoustic wave device of "Embodiment 2" of the present invention.

FIG. 15 shows the amplitudes of the vibrational displacements in the transverse direction or in the direction of width (the Y-direction), which are exhibited by the aforementioned surface acoustic wave devices of FIGS. 1 and 2. In FIG. 15, reference number 300 denotes a piezoelectric plate; 301 and 302 IDTs (transverse sections of SAW resonators); 303 a fundamental wave oblique symmetry mode A0; and 304 a first order oblique symmetry mode A1. It is characteristic of both of the amplitudes of the vibrational displacements in the oblique symmetry modes 303 and 304 to be nearly symmetric with respect to the central point O between the two SAW resonators. In the case of this embodiment of the present invention, it is preferable that the fundamental oblique symmetry mode A0 is used.

Figure 16:
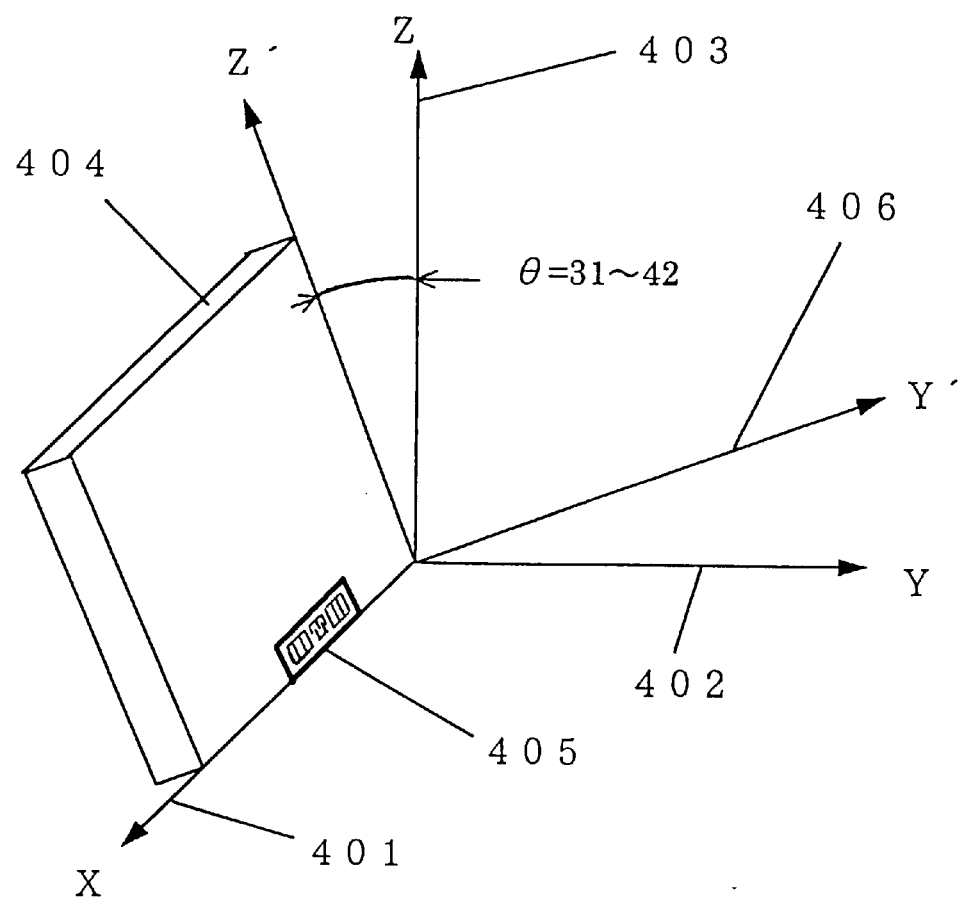
FIG. 16 is a diagram for illustrating a cutting direction employed in the case of an ST-cut quartz crystal plate used in a surface acoustic wave device of "Embodiment 2" of the present invention.

FIG. 16 is a diagram for illustrating a cutting direction employed in the case of a crystal ST-cut element used in the SAW device according to this embodiment of the present invention. In this figure, reference numeral 401 denotes an electrical axis of the quartz crystal; 402 a mechanical axis thereof; and 403 an optical axis thereof. These axes compose a right-hand orthogonal coordinate system. Further, reference numeral 404 denotes a quartz crystal plate that is obtained by rotating a Y-cut plane, which is perpendicular to the Y-axis 402, around the electrical axis 401 counterclockwise by an angle θ of 31 to 42 degrees. In the case of a surface acoustic wave element 405, a cutting direction is set in such a manner that the phase propagation direction of a surface acoustic wave is the same as the direction of the electrical axis (401).

Figure 17:
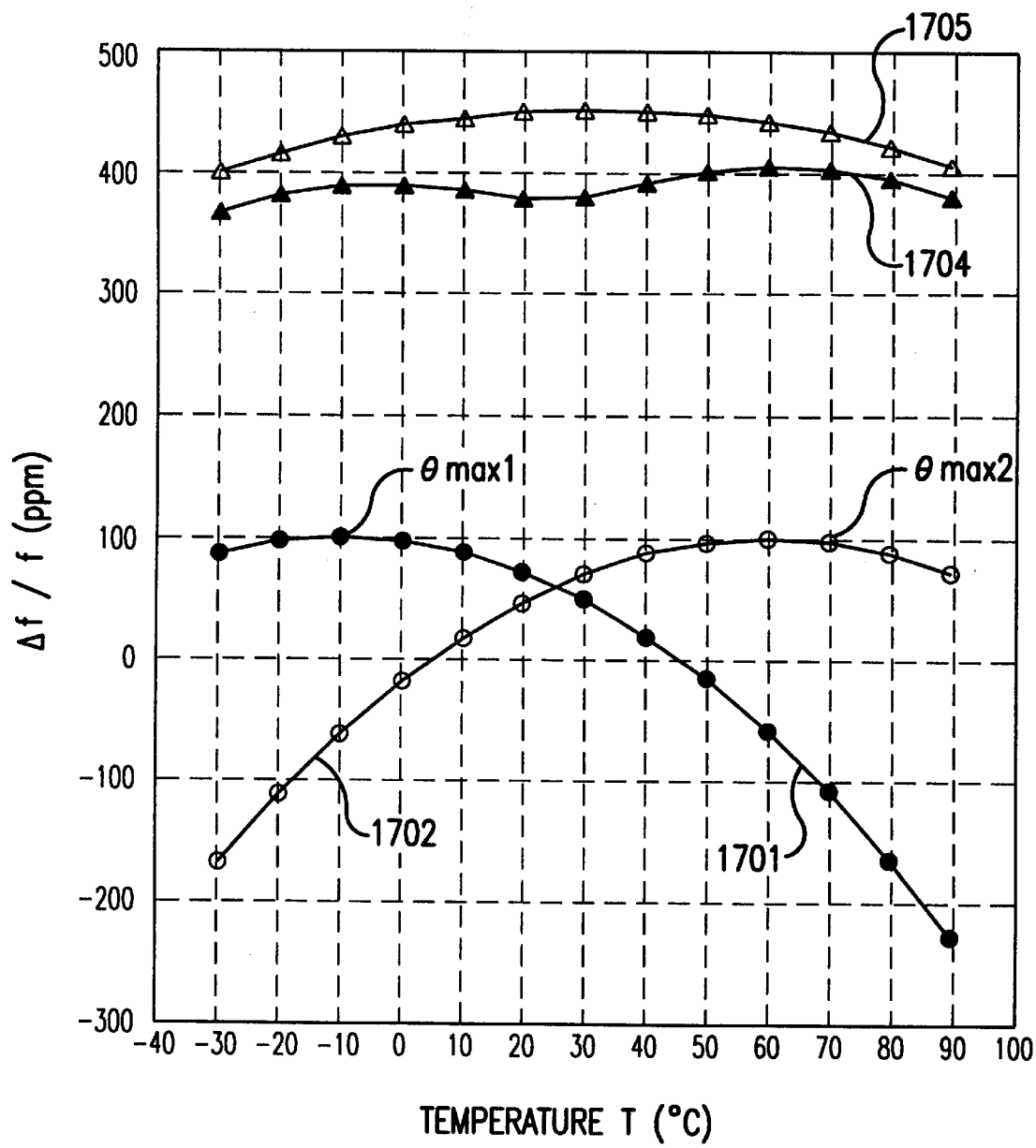
FIG. 17 is a graph for illustrating the frequency-temperature characteristics of a surface acoustic wave device according to "Embodiment 2" of the present invention.

FIG. 17 illustrates the frequency-temperature characteristics exhibited by the ST-cut devices of FIGS. 1 and 2. In FIG. 17, the abscissa represents an ambient temperature T(° C.) and the ordinate represents the rate of change in frequency Δf/f (in ppm). Further, reference numbers 1701 and 1702 designate upward-convex nearly-quadratic-function curves which respectively represent the frequency-temperature characteristics of the first and second resonators in the case where there is no elastic coupling. The curve 1701 has a peak temperature $\theta_{max1}$. Further, the curve 1702 has a peak temperature $\theta_{max2}$. The frequency-temperature characteristics 1701 and 1702 are represented by the same function as represented by the equation (1). In the case of "Embodiment 2" of the present invention, the term associated with γ is often negligibly small.

Curves 1704 and 1705 represent the frequency-temperature characteristics of the first and second resonators coupled to each other in the fundamental oblique symmetry mode A0. The difference between the shapes of the curves 1704 and 1705 varies with the combination of the frequency-temperature characteristics of the first and second resonators $\Delta\theta=\theta_{max2}-\theta_{max1}$ and depends upon the distance G between the resonators and the width Wc of each of the resonators. The curve 1704 corresponds to the case where the elastic coupling is weak. In contrast, the curve 1705 corresponds to the case where the elastic coupling is strong. The optimum combination of conditions for making the frequency-temperature characteristics of the resonators, which are in the coupled state, flat depends on the material of the piezoelectric plate and the cutting direction. This is due to the difference in magnitude of effective shear stiffness constant a between the resonators, which determines the degree of the elastic coupling therebetween, and to the difference in frequency-temperature characteristics therebetween, which is present when a single resonator is composed. In the case of the quartz crystal ST-cut element, the constant a ranges from about 0.03 to 0.04 under normal design conditions. Further, the constant a is a parameter contained in the differential equation which governs or prescribes the displacement of the resonator in the transverse-mode such as an oblique symmetry mode and a symmetry mode and is the same as the equation (2).

Moreover, it is preferable for optimizing the frequency-temperature characteristics that the finger overlap width Wc of the resonator is 10 to 30 times the wavelength of the surface acoustic wave, that the distance G between the resonators is 1 to 5 times the wavelength of the surface acoustic wave and that the difference Δθ between the peak temperature of the frequency-temperature characteristics is in a range of 30 to 80° C. Thereby, in the temperature range between −30 to 90° C., the frequency accuracy can be 30 ppm at best and 90 ppm at worst. When such best frequency accuracy is realized, the difference Δθ is 70° C. and the peak temperatures $\theta_{max1}=-10°$ C. and $\theta_{max2}=60°$ C. Meanwhile, in the case of the temperature characteristics of the single ST-cut resonator, the second order temperature coefficient $\beta=-3.3\times10^{-8}/°$ $C^2$. Thus, in the temperature rage between −30 to 90° C., the frequency accuracy is about ±60 ppm. Therefore, the frequency accuracy can be improved by a factor of 4.

Figure 18:
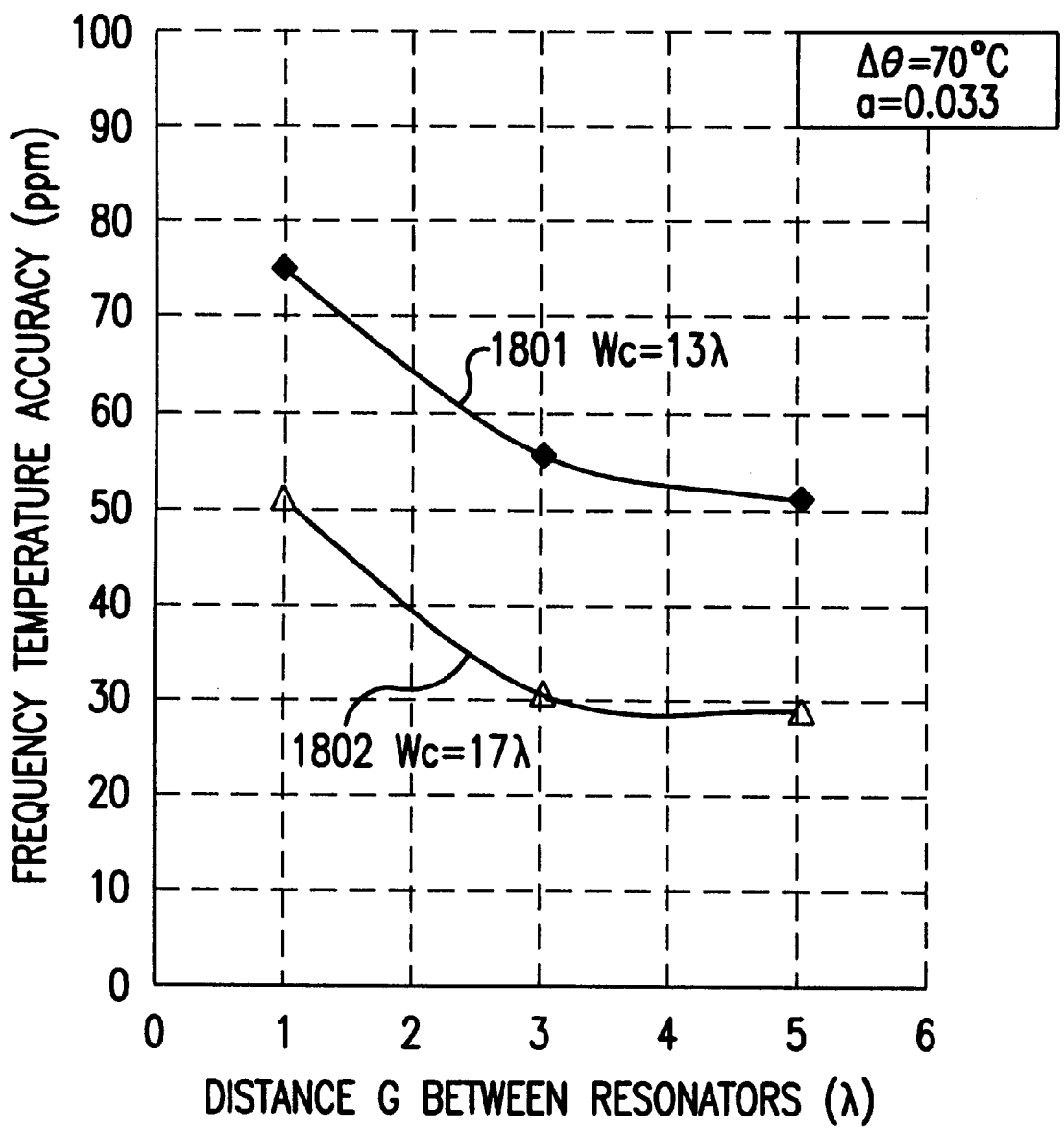
FIG. 18 is a graph for illustrating the frequency temperature accuracy characteristic of a surface acoustic wave device as a function of distance between resonators according to "Embodiment 2" of the present invention.
Figure 19:
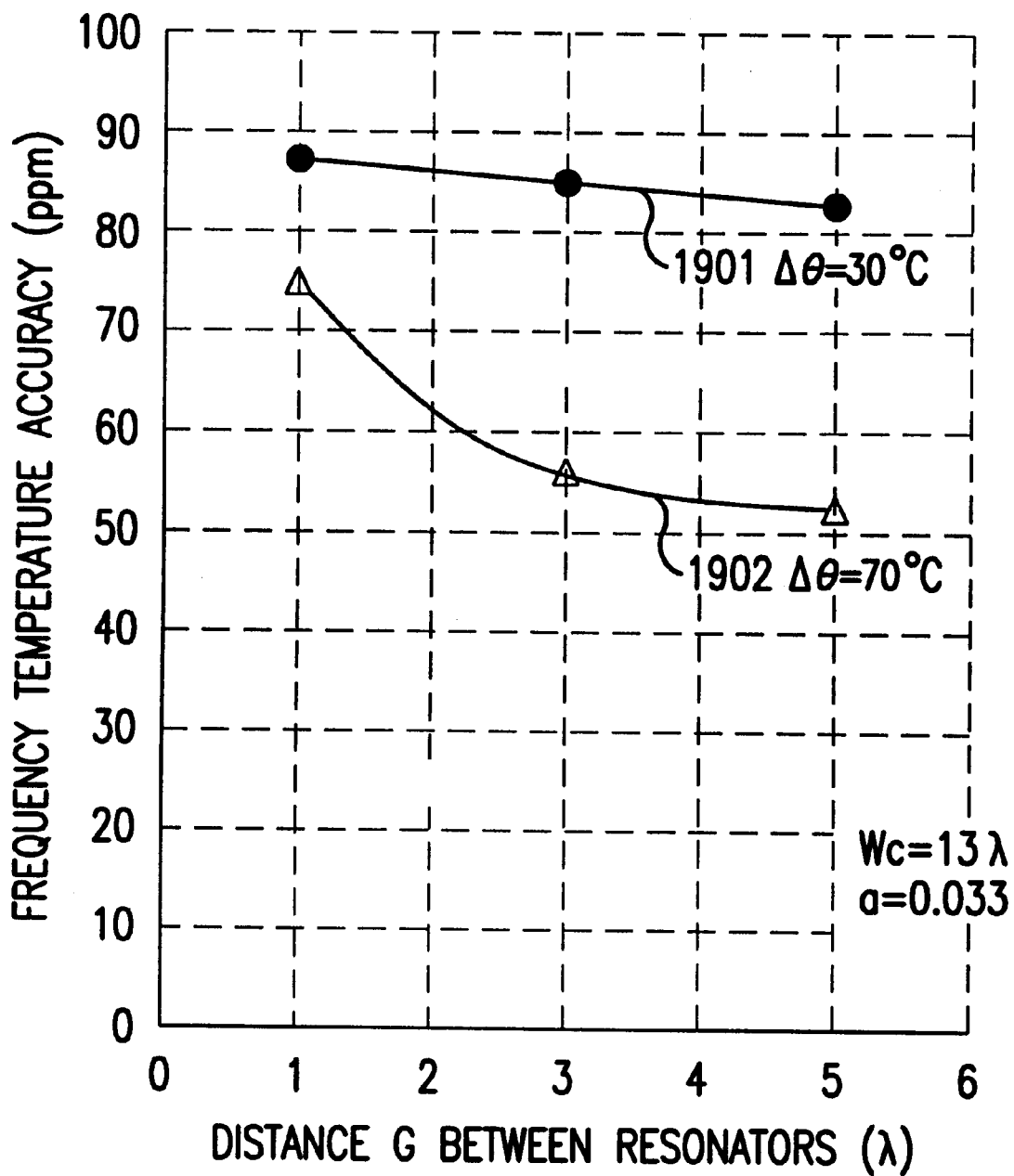
FIG. 19 is a graph for illustrating the frequency temperature accuracy characteristic of a surface acoustic wave device as a function of distance between resonators according to "Embodiment 2" of the present invention.
Figure 22:
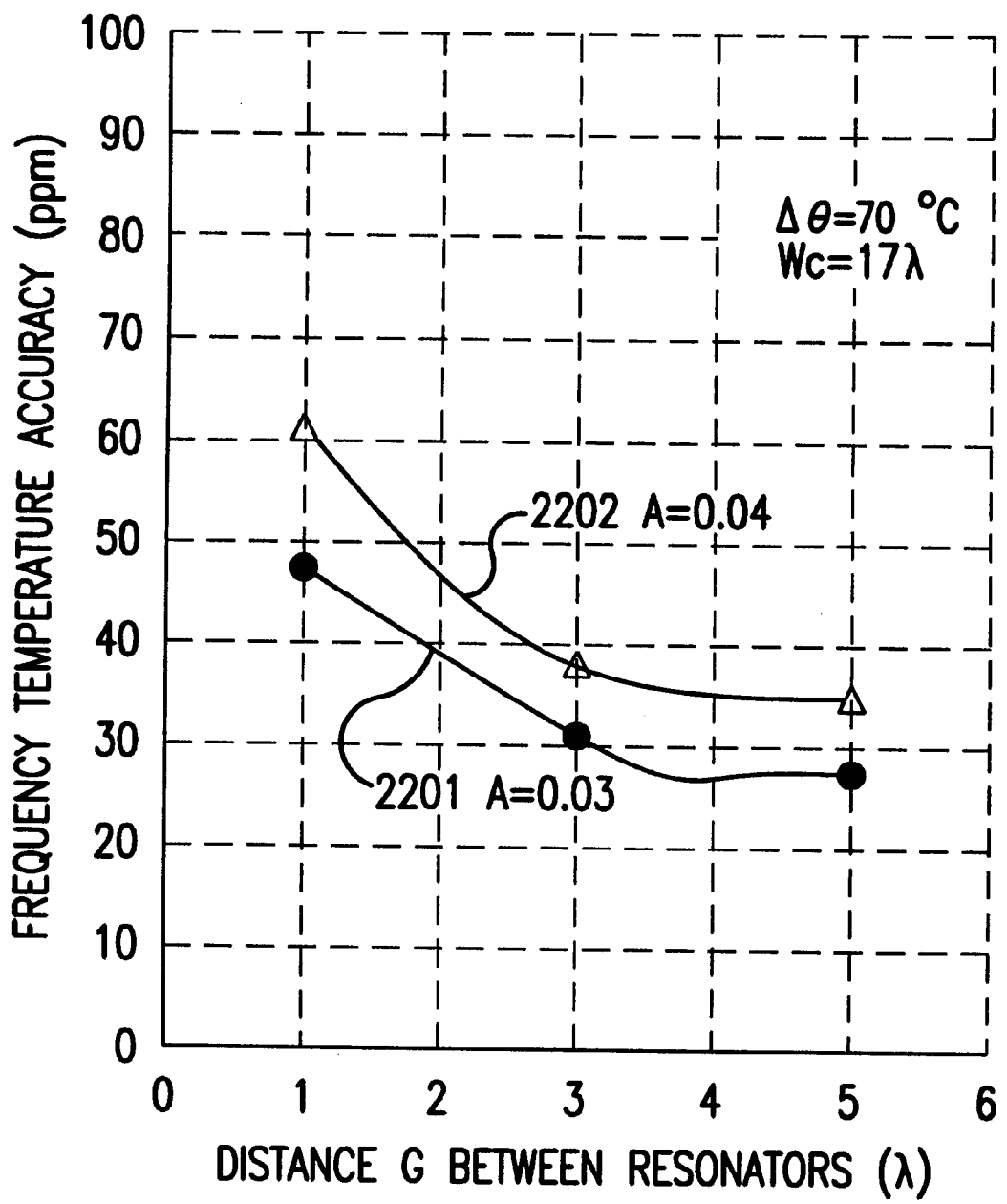
FIG. 22 is a graph for illustrating the frequency temperature accuracy characteristic of a surface acoustic wave device as a function of distance between resonators according to "Embodiment 2" of the present invention.
Figure 23:
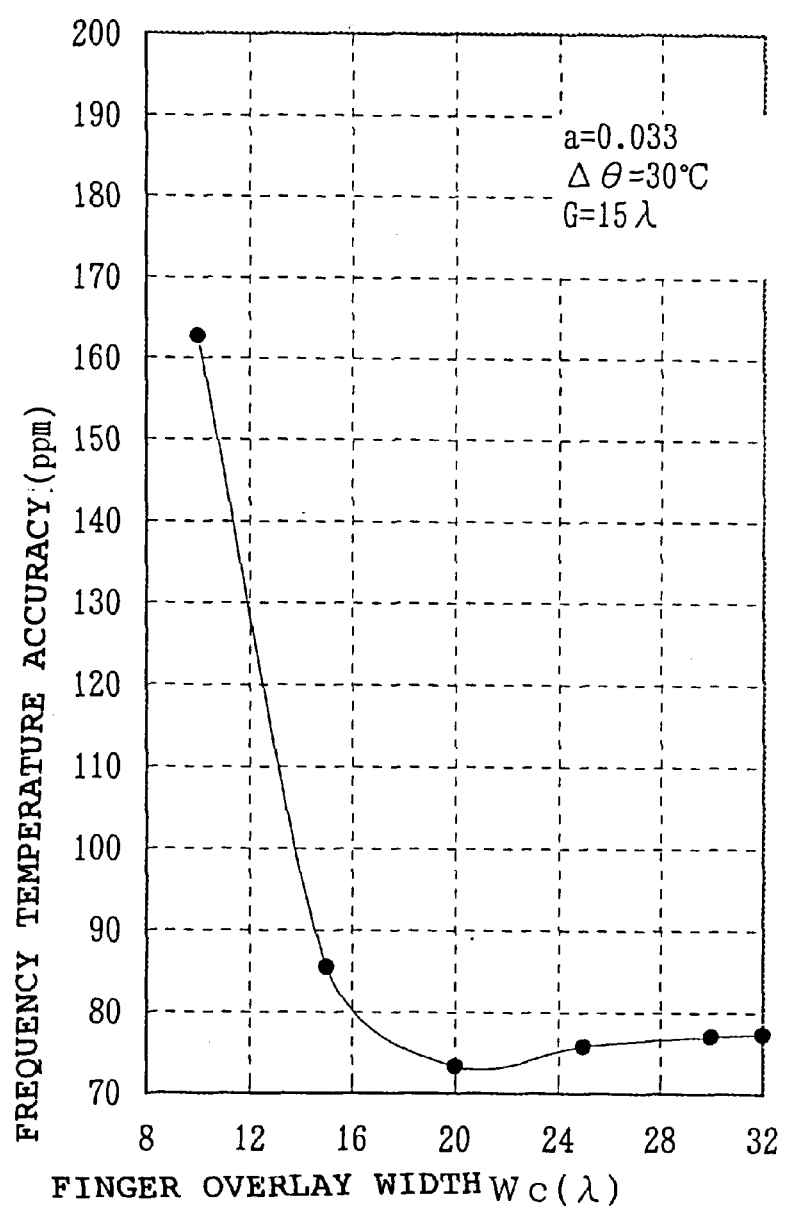
FIG. 23 is a graph for illustrating the frequency temperature accuracy characteristic of a surface acoustic wave device as a function of finger overlap width according to "Embodiment 2" of the present invention.

The above-mentioned characteristics of the frequency temperature accuracy at the time of coupling the resonators (namely, the change in frequency in the temperature range of −30 to 90° C.) is illustrated in FIGS. 18, 19 and 22, in each of which the abscissa represents the distance G between the resonators and among which the parameters Wc, Δθ and a are changed. In FIG. 18, lines 1801 and 1802 represent the cases where the overlap width Wc of the resonator is 13 times and 17 times the wavelength of the surface acoustic wave, respectively. In FIG. 19, lines 1901 and 1902 represent the cases where the difference Δθ between the peak temperature of the frequency-temperature characteristics is 30° C. and 70° C., respectively. In FIG. 22, lines 2201 and 2202 represent the cases where the constant a is 0.03 and 0.04, respectively. Further, the frequency temperature accuracy at the time of coupling the resonators is illustrated in FIG. 23 in which the axis of abscissa represents the finger overlap (width) Wc of the resonator and in which the parameters G, Δθ and a are changed.

Figure 20A:
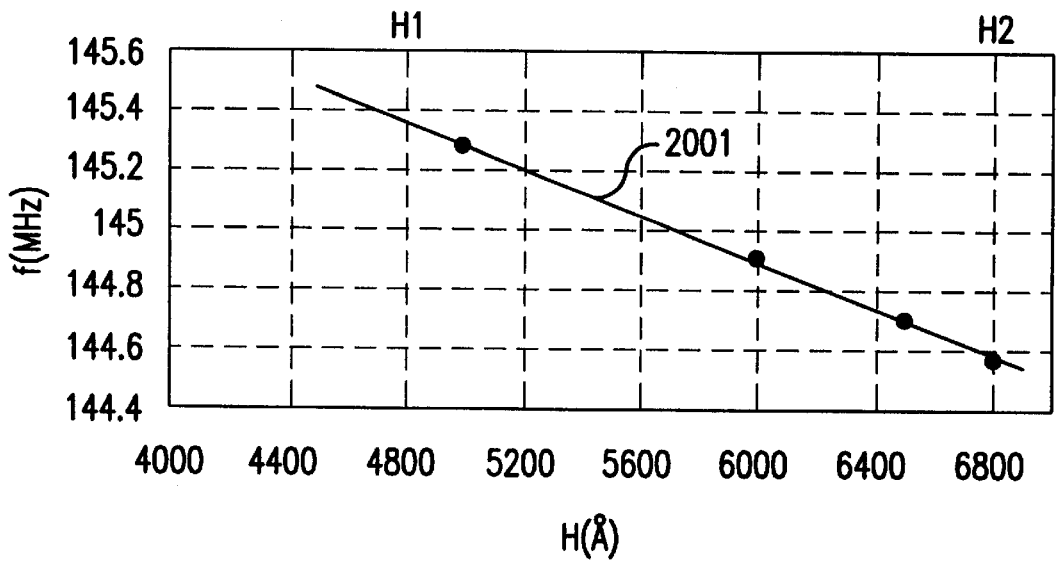
FIGS. 20(a) and 20(b) are graphs for illustrating film thickness characteristics of a surface acoustic wave device according to "Embodiment 2" of the present invention.
Figure 20B:
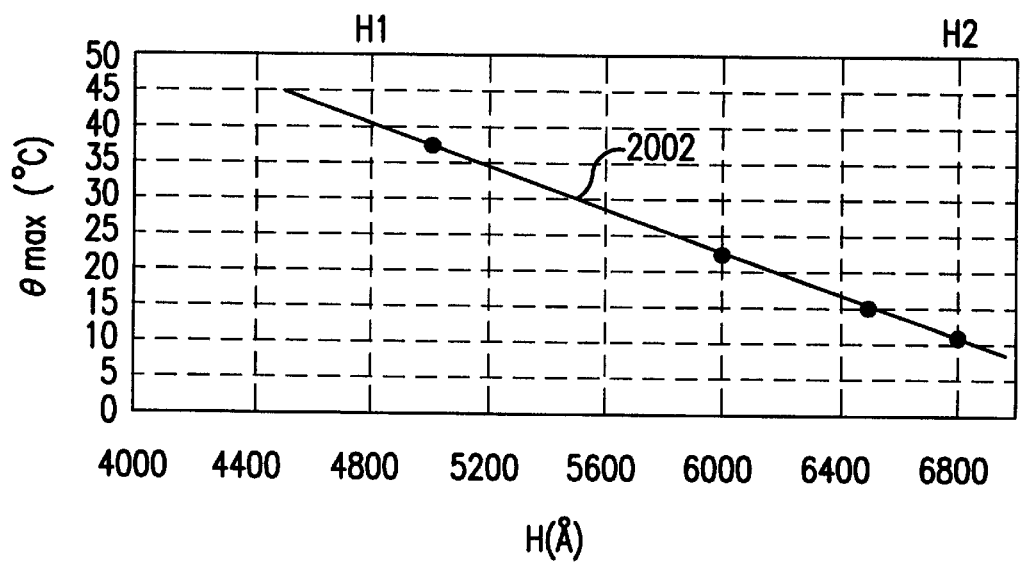

Next, a practical method of designing the surface acoustic wave device according to this embodiment of the present invention will be described hereinbelow by referring to FIGS. 20(*a*), 20(*b*), 21(*a*) and 21(*b*). When designing the surface acoustic wave device, it is necessary to make the frequencies, which respectively correspond to the peak temperatures $\theta_{max1}$ and $\theta_{max2}$ of the first and second surface acoustic wave elements (namely, resonators or the like), closer to each other as much as possible. A method for realizing such conditions is illustrated in FIGS. 20(*a*) and 20(*b*). In these figures, the abscissa represents the thickness H of the electrode of the surface acoustic wave element. Further, the ordinate of FIG. 20(*a*) represents the frequency, and the ordinate of FIG. 20(*b*) represents the peak temperature $\theta_{max}$. Moreover, a line 2001 represents the frequency-change characteristics, and another line 2002 designates the characteristics of change in peak temperature $\theta_{max}$. For example, in the case of designing the one-port resonator of FIG. 1 having the resonance frequency of 144.975 MHz, the electrode thickness H1 of the first resonator and the electrode thickness H2 of the second resonator are set at 4800 Å and 6800 Å, respectively, so that the peak temperatures of the two resonators are made to be different from each other. Thus, the difference Δθ between the peak temperatures is set at about 30° C. The frequencies of the resonators change as indicated by the line 1101, so that the frequencies thereof respectively corresponding to the electrode thicknesses become 145.37 MHz and 144.58 MHz. This results in the frequency difference Δ=2725 ppm. To eliminate this frequency difference, the electrode pitches P of the resonators are set as follows. The electrode pitch P1 corresponding to the first resonator is set according to the equation (3). Further, the electrode pitch P2 corresponding to the second resonator is set according to the equation (4). Thereby, the frequencies of the first and second resonators are in agreement with each other.

Figure 21A:
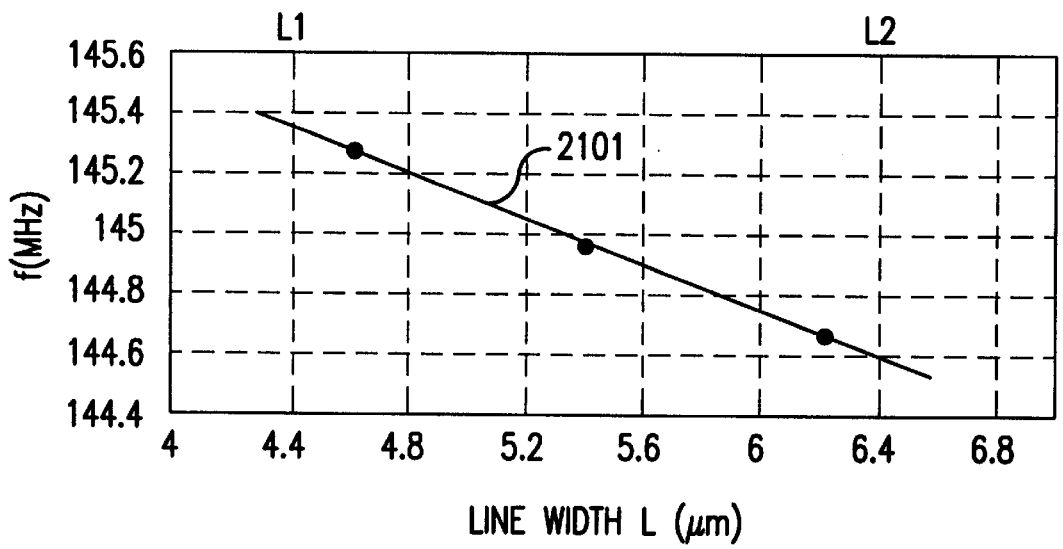
FIGS. 21(a) and 21(b) are graphs for illustrating line width characteristics of a surface acoustic wave device according to "Embodiment 2" of the present invention.
Figure 21B:
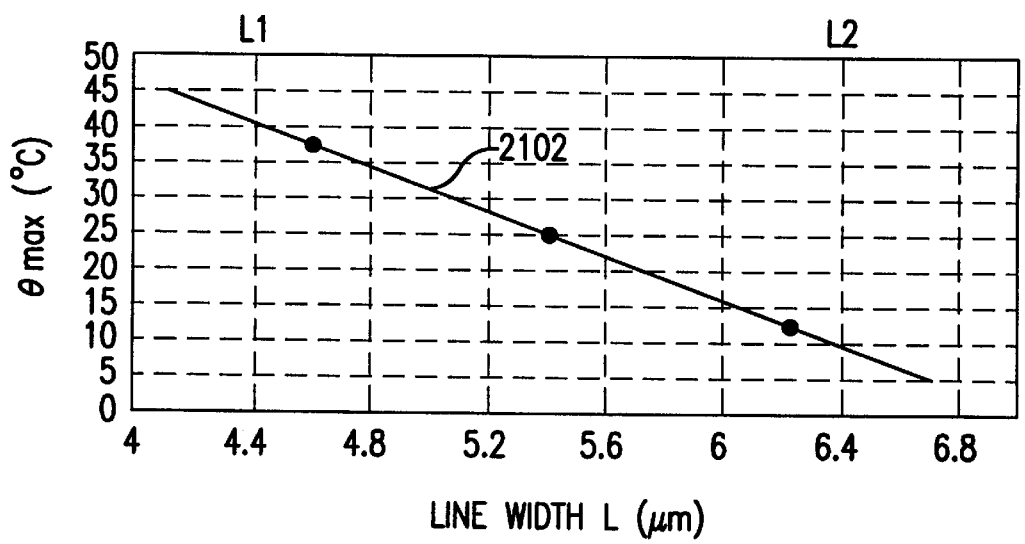

Moreover, another method for designing the surface acoustic wave device is illustrated in FIGS. 21(*a*) and 21(*b*). In the case of this example, the designed frequency of the surface acoustic wave device is set at 144.97 MHz. In this figure, the abscissa represents the line width L of each of the surface acoustic wave fingers. Furthermore, the ordinate of FIG. 21(*a*) and the ordinate of FIG. 21(*b*) represent the resonance frequency f and the peak temperature $\theta_{max}$, respectively. Further, a curve 2101 represents the frequency characteristics of the resonators, and another curve 2102 represents the characteristics of the peak temperatures $\theta_{max}$. The peak temperatures $\theta_{max}$ corresponding to the line widths L1=4.400 μm and L2=6.400 μm are about 40° C. and 10° C., respectively. Moreover, the frequencies corresponding to these line widths are 145.360 MHz and 144.580 MHz, respectively. Consequently, the frequency difference Δ is about 2690 ppm. This frequency difference can be eliminated by setting and correcting the electrode pitches P of the surface acoustic wave devices according to the equations (3) and (4) similarly as in the case of FIGS. 20(*a*) and 20(*b*).

The derivation of equation (2) will now be described in detail.

Assuming that the elements are oscillating as the resonators, the equation for calculating the transverse-mode frequency characteristics of the SAW resonators will be derived by the following method, instead of employing an approach based on the wave theory.

Figure 24:
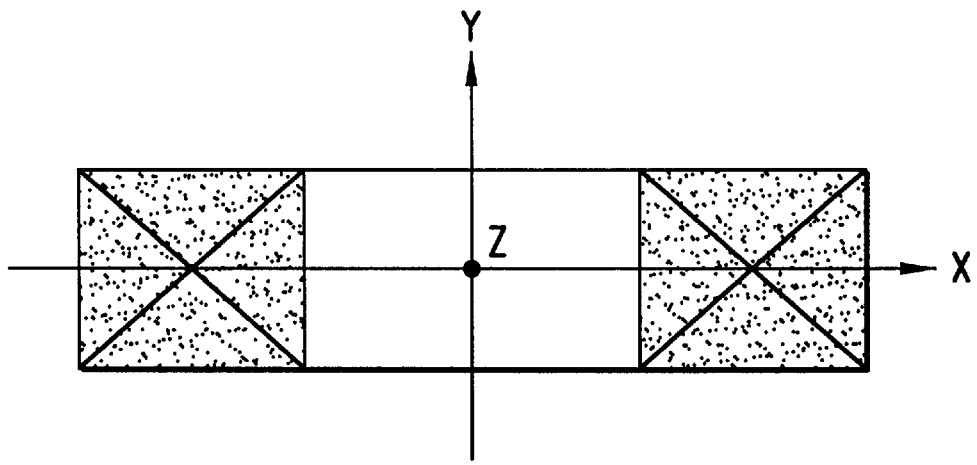
FIG. 24 is a diagram for showing a coordinate system of a surface acoustic wave device, which is used for illustrating an operation of each of "Embodiment 1" and "Embodiment 2" of the present invention.
Figure 25:
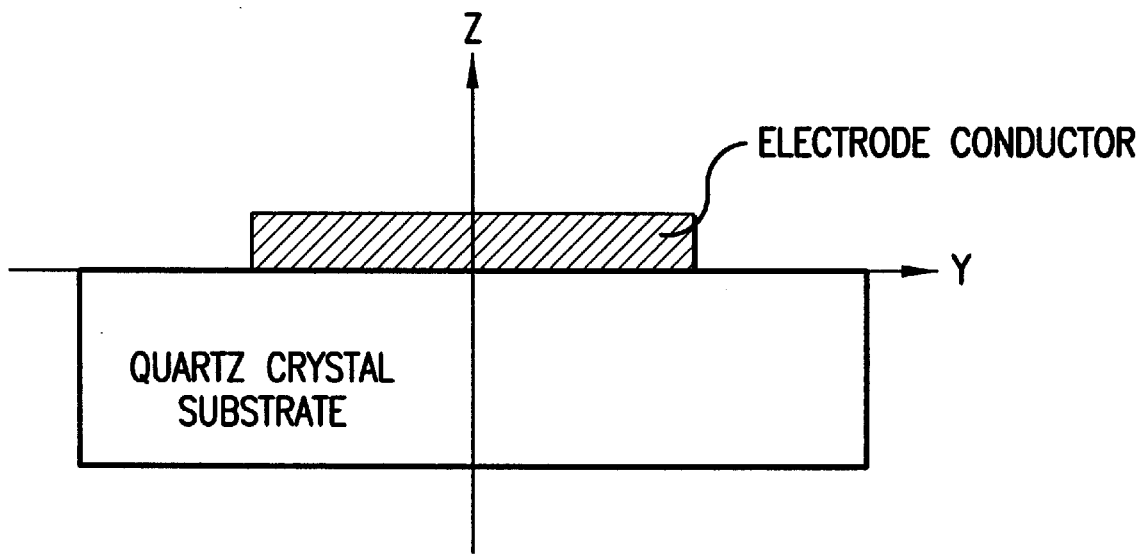
FIG. 25 is a diagram for showing the coordinate system of a surface acoustic wave device, which is used for illustrating the operation of each of "Embodiment 1" and "Embodiment 2" of the present invention.

The coordinate system of the SAW resonator is established as illustrated in FIGS. 24 and 25. Considering the state of the transverse displacement of the SAW resonator, the vibrational displacement thereof can be written or represented as a specific continuous function v(y). In the case where this displacement v(y) changes smoothly in the direction of the y-axis, it can be considered that a shear stress occurs. In consideration of this, the derivation will be unfolded as follows.

When the SAW resonator is in a stationary vibration state, the total energy thereof is represented as a sum of kinetic energy and strain energy of all parts of the resonator. Here, let "ρ", "U(x,y,z)", "U(x,y,z),t", "T(x,y,z)", "S(x,y,z)", "k" denote the density of a quartz crystal, a displacement at a place (x,y,z), a particle velocity (",t" means "differential with respect to time t"), a stress, a strain and a spring constant, respectively. The kinetic energy dK of an infinitesimal part is given by:

$$dK = \rho U(x,y,z),t^2/2 \, dx\,dy\,dz \tag{5}$$

Further, the strain energy dE of an infinitesimal part is given by:

$$dE = \int_0^S T(s)\,dS\,dx\,dy\,dz = T(x,y,z)S(x,y,z)/2\,dx\,dy\,dz. \tag{6}$$

Thus, the total energy (K+E) of the entire SAW resonator is obtained by integrating (dK+dE) over the whole region in which the vibration is performed. Namely, $$K+E = \iiint (dK+dE)\,dx\,dy\,dz \tag{7}$$

In the field of dynamics or mechanics, Lagrange's method is famous as a method for treating an equation of motion of a physical system. A governing equation of a transverse mode will be derived hereinbelow according to this method.

First, note that Lagrangian is obtained by subtracting the strain energy E, (potential energy in the wider sense) from the kinetic energy K. Thus, $$2L = 2(K-E) = \iiint \{\rho U(x,y,z),t^2 - T(x,y,z)S(x,y,z)\}\,dx\,dy\,dz \tag{8}$$

Then, the following equation (9) is obtained by integrating the right side of this equation (8) with respect to z (corresponding to the direction of depth of the resonator) and to x (corresponding to the longitudinal direction in which a surface acoustic wave propagates).

$$2L = \int \{mV(y),t^2 - T(y)S(y)\}dy \qquad (9)$$

Here, the centralized displacement V(y), which is obtained by the integration, and the derivative of such a displacement with respect to the y-coordinate can be substituted into the aforementioned strains. Namely, $$S_1 = V(y), S_2 = V(y),y \qquad (10)$$

Thereby, the stress T is given by $$T(y) = kS_1 - bS_2 = kV(y) - bV(y),y \qquad (11)$$

where k and b designate spring constants. Thus, the equation (9) is rewritten as follows.

$$2L = \int (mV(y),t^2 - (TS_1 + TS_2))dy \qquad (12)$$

Meanwhile, as is understood from the following equations, the term $V(y)V(y),y$ of the strain energy ($TS_1 + TS_2$) is negligible.

$$\int_{-\infty}^{\infty} V(y)V(y), y\, dy = [V(y)^2]_{-\infty}^{\infty} - \int V(y),$$

$$yV(y)d\, y2 \int_{-\infty}^{\infty} V(y)V(y), yd\, y = [V(y)^2]_{-\infty}^{\infty} = 0$$

This is because it can be considered that actually, $V(\pm\infty) = 0$. Thence, the equation (12) is rewritten as the following equation.

$$2L = \int (mV(y),t^2 - kV(y)^2 + bV(y),y^2)dy \qquad (13)$$

Subsequently, Lagrange's equation of motion is used for deriving the governing equation. Namely, $$L, pt - L, q = 0 \qquad (14)$$

where a generalized velocity $p = V(y),t$ and a generalized coordinate $q = V(y)$.

When substituting the equation (13) for the equation (14), the following equation is obtained:

$$\int 2(mV(y),tt + kV(y) - bV(y),yy)dy = 0 \qquad (15)$$

by using the following relation:

$$\partial(V,y)^2/\partial V = \partial(V,y)^2/\partial y \cdot (\partial y/\partial V) = 2V,y \cdot V,yy \cdot y, V = 2V,yy \qquad$$

Note that if the following equation (16) holds, the equation (15) also holds.

$$mV(y),tt + kV(y) - bV(y),yy = 0 \qquad (16)$$

Further, setting $$\omega_0^2 = K/m \qquad (17)$$

and $$b/m = b/K \cdot K/m = a\lambda^2 \omega_0^2 \qquad (18),$$

$\omega_0$ is an angular frequency $2\pi f$ and corresponds to an angular frequency in the case that the transverse displacement (namely, the displacement in the direction of width) of the SAW resonator is constant. Further, the constant a is a coefficient that can be regarded as a transverse effective shear stiffness constant (a nondimensional number).

Thus, a solution of the equation (16), namely, the transverse vibrational displacement V(y) can be set as follows:

$$V(y,t) = V(y)\exp(-j\omega t), Y = y/\lambda \qquad (19)$$

When substituting this solution into the equation (16) and using the relation $\partial/\partial y = \partial/\lambda\partial Y$, the following equations are obtained:

$$-\omega^2 V(Y) + \omega_0^2 V(Y) - a\omega_0^2 V(Y), YY = 0$$

$$a\omega_0^2 V(y), YY + (\omega^2 - \omega_0^2)V(Y) = 0 \qquad (20)$$

Moreover, it can be considered by further stretching interpretation that the angular frequency $\omega_0$ changes spatially. Thus, the following equation is obtained as a final equation.

$$a\omega_0(Y)^2 V(Y), YY + (\omega^2 - \omega_0(Y)^2)V(Y) = 0 \qquad (21)$$

The constant a of the above expression is determined in such a way that the resonance frequencies of the transverse modes of the ST-cut element and the K-cut element agree with each other. The agreement between the actual value of the resonance frequency and the value thereof calculated from the equation (21) is extremely good. Further, there is a noticeable difference between the value of the constant a (=0.033) in the case of the ST-cut element and that of the constant a (=0.014) in the case of the K-cut element. This manifests the anisotropy of the quartz crystal.

Next, a method of calculating the frequency temperature characteristics of the transverse-elastic-coupling SAW resonators will be described hereinbelow.

Figure 26:
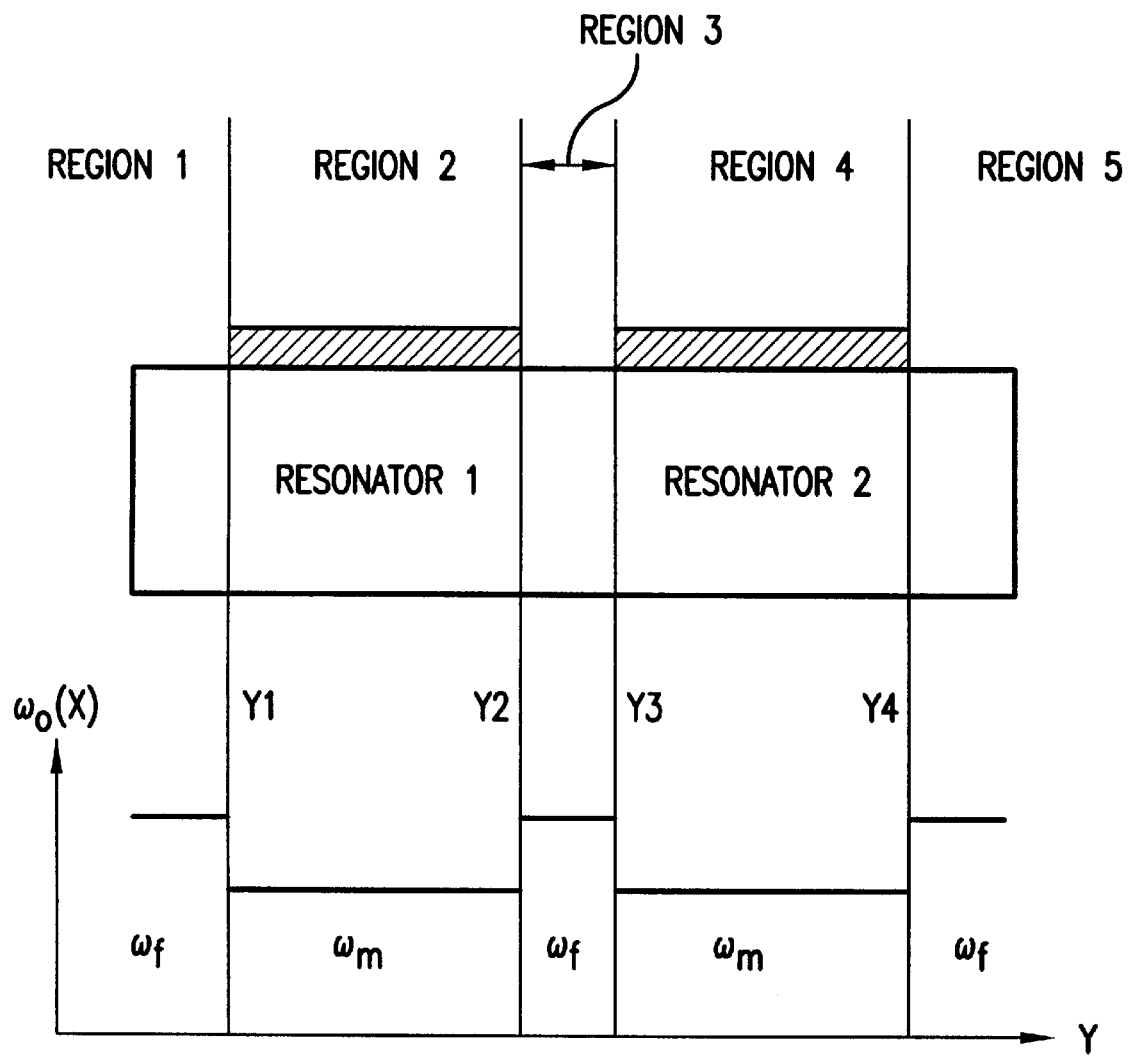
FIG. 26 is a transverse sectional view of the configuration of a surface acoustic wave device, which is used for illustrating an operation of each of "Embodiment 1" and "Embodiment 2" of the present invention.

Referring now to FIG. 26, there is shown the transverse sectional configuration of the transverse-elastic-coupling SAW resonator. As shown in this figure, the resonators 1 and 2 are placed in such a manner as to be parallel with and proximate to each another. Here, the angular frequency $\omega_0(Y)$ of each region has a value $\omega_m$ under a region, in which an electrode is present, and also has another value $\omega_f$ under a free surface, on which no electrode is present. Further, in the quartz crystal, the ratio between these values is obtained as follows.

$$\omega_m/\omega_f = \omega_{00}/\omega_f = \text{approximately } 0.99 \text{ to } 0.98 \qquad (22)$$

where $\omega_{00}$ represents the nominal frequency of each of the resonators 1 and 2. Equation (22) gives the frequency drop of the resonator upon forming the electrodes.

Next, the frequency temperature characteristics of each resonator (represented in terms of the rate of change in frequency) is set as follows. In the case of the resonator 1, $$\omega_{m1}/\omega_{00} = 1 + \beta_1(\theta - \theta_{max1})^2 + \gamma_1(\theta - \theta_{max1})^3 + P_{01} \qquad (23)$$

Further, in the case of the resonator 2, $$\omega_{m2}/\omega_{00} = 1 + \beta_2(\theta - \theta_{max2})^2 + \gamma_2(\theta - \theta_{max2})^3 + P_{02} \qquad (24)$$

In these equations, in the case of the K-cut element, $\theta$ designates a temperature; $\beta_1$ and $\beta_2$ second order temperature coefficients ($-2.5 \times 10^{-8}/°C.^2$); and $\gamma_1$ and $\gamma_2$ third order temperature coefficients ($3 \times 10^{-8}/°C.^3$); $\theta_{max1}$ and $\theta_{max2}$ peak temperatures, the difference between which is several tens of degrees; $P_{01}$ and $P_{02}$ the quantities of change in frequency at the peak temperatures; and $\omega_{00}$ the nominal frequency of each resonator.

Next, wave numbers are set as follows.

Namely, normalized wave numbers $K_p$, which is normalized in terms of the wavelength of surface acoustic waves in the regions 1, 3 and 5, and normalized wave numbers $K_{m1}$ and $K_{m2}$ respectively corresponding to the regions 2 and 4 are defined as follows:

$$K_f^2 = (k_f/k_0)^2 = (1 - ((\omega/\omega_{00})^2(\omega_{00}/\omega_f)^2)/a \qquad (25)$$

$$K_{m1} = (k_{m1}/k_0)^2 = ((\omega/\omega_{00})^2(\omega_{00}/\omega_{m1})^2 - 1)/a \qquad (26)$$

$$K_{m2}=(k_{m2}/k_0)^2=((\omega/\omega_{00})^2(\omega_{00}/\omega_{m2})^2-1)/a \qquad (27)$$

Next, the vibrational displacements are set as follows.
In the case of the region 1,
the displacement $V(Y)' = A_1 \text{ EXP } (K_f(Y+Yc))$;
the stress $T(Y) = A_1 K_f \text{EXP}(K_f(Y+Yc))$.
In the case of the region 2,
the displacement $V(Y) = A_2 \text{ COS}(K_{m1}(Y+Yc)) + A_3 \text{ SIN}(K_{m1}(Y+Yc))$;
the stress $T(Y) = -A_2 K_{m1} \text{ SIN}(K_{m1}(Y+Yc)); +A_3 K_{m1} \text{ COS}(K_{m1}(Y+Yc))$.
In the case of the region 3,
the displacement $V(Y) = A_4 \text{ SINH}(K_f Y) + A_5 \text{ COSH}(K_f Y)$;
the stress $T(Y) = A_4 K_f \text{ COSH}(K_f Y) + A_5 K_f \text{ SINH}(K_f Y)$.
In the case of the region 4, the displacement $V(Y) = A_6 \text{ COS}(K_{m2}(Y-Yc)) + A_7 \text{ SIN}(K_{m2}(Y-Yc))$;
the stress $T(Y) = -A_6 K_{m2} \text{ SIN}(K_{m2}(Y-Yc)) + A_7 K_{m2} \text{ COS}(K_{m2}(Y-Yc))$.
In the case of the region 5,
the displacement $V(Y) = A_6 \text{ EXP}(-K_f(Y-Yc))$;
the stress $T(Y) = -A_8 K_f \text{EXP}(-K_f(Y-Yc))$.
Additionally, $Yc = G/2 + Wc/2$,
$Y1 = -(G/2 + Wc)$,
$Y2 = -G/2$
Also, G designates the distance between the resonators, and Wc denotes the width (dimension) of the resonator. Both of G and Wc are normalized in terms of the wavelength $\lambda$.

Next, the resonance frequency is calculated as follows.
Formulating a boundary condition equation by supposing that the displacement and the stress are continuous on boundaries Y=Y1, Y2, Y3 and Y4 of FIG. 26, the following 8×8 matricial equation is obtained:

$$\sum_{j=1}^{3} Cij(\omega)Aj = 0 \qquad (28)$$

where $C_{ij}$ denotes a coefficient determined from the aforementioned equations with respect to the displacement and the stress.

Thus, the resonance frequency of the transverse-elastic-coupling SAW resonator is obtained as follows. The wave numbers are first obtained by substituting the angular frequencies $\omega_{m1}$ and $\omega_{m2}$ of the resonators 1 and 2 at the temperature $\theta$ (see equations (23) and (24)) in the equations (25) to (27). Then, the coefficient $C_{ij}(\omega)$ is computed. Subsequently, the value of $(\omega/\omega_{00})$, which satisfies the following determinant obtained from the equation (28), is found as the resonance frequency.

$$DET(C_{ij}(\omega))=0 \qquad (29)$$

Although the preferred embodiments of the present invention have been described above, it should be understood that the present invention is not limited thereto and that other modifications will be apparent to those skilled in the art without departing from the spirit of the invention.

The scope of the present invention, therefore, should be determined solely by the claims.

What is claimed is:

1. A surface acoustic wave device comprising:
    a plurality of surface acoustic wave resonators placed on a piezoelectric plate proximate to one another, each of the surface acoustic wave resonators comprising at least one interdigital transducer and at least one pair of reflectors, each of the surface acoustic wave resonators having different frequency-temperature characteristics, and
    the surface acoustic wave resonators being transversely elastically coupled to each other such that the plurality of surface acoustic wave resonators compose a single coupling resonator;
    wherein a condition of the transverse elastic coupling is determined according to the following equation:

$$a\omega_0^2(\partial^2 V(Y)/\partial Y^2)+(\omega^2-\omega_0^2)V(Y)=0$$

where $\omega$ designates an angular frequency; $\omega_2$ an element angular frequency of a concerned region; V(Y) an amplitude of a surface acoustic wave displacement in a direction of width; Y a Y-coordinate of the surface acoustic wave device, which is normalized in terms of a wavelength of a surface acoustic wave; and a a constant.

2. The surface acoustic wave device according to claim 1, wherein an interdigital transducer of a first one of the surface acoustic wave resonators is a first interdigital sub-transducer and an interdigital transducer of a second one of the surface acoustic wave resonators is a second interdigital sub-transducer, wherein the first and second interdigital sub-transducers are connected in series with each other and are excited in such a manner as to be of opposite phases.

3. The surface acoustic wave device according to claim 1, wherein the surface acoustic wave resonators are in an oblique symmetry mode in which a transverse elastic coupling of respective displacements is performed and displacements oscillate in such a way as to be of opposite phase.

4. The surface acoustic wave device according to claim 3, wherein the oblique symmetry mode is a fundamental wave mode (A0).

5. The surface acoustic wave device according to claim 1, wherein the surface acoustic wave resonators are of the one-port type.

6. The surface acoustic wave device according to claim 1, wherein the surface acoustic wave resonators are of the two-port type.

7. The surface acoustic wave device according to claim 1, wherein the frequency-temperature characteristics have different peak temperatures and are represented by nearly-quadratic functions, each of which is upwardly convex.

8. The surface acoustic wave device according to claim 1, wherein a difference ($\Delta\theta$) between peak temperatures of the frequency-temperature characteristics of each pair of the surface acoustic wave resonators is within a range of 30 to 80° C.

9. The surface acoustic wave device according to claim 1, wherein a difference ($\Delta\theta$) between the peak temperatures of the frequency-temperature characteristics of each pair of the surface acoustic wave resonators is realized by making film thicknesses of the interdigital transducers differ from one another.

10. The surface acoustic wave device according to claim 1, wherein a difference $\Delta\theta$ between peak temperatures of the frequency-temperature characteristics of each pair of the surface acoustic wave resonators is realized by making line widths of the interdigital transducers differ from one another.

11. The surface acoustic wave device according to claim 1, wherein an interdigital transducer of a first one of the surface acoustic wave resonators is a first interdigital sub-transducer and an interdigital transducer of a second one of the surface acoustic wave resonators is a second interdigital sub-transducer, wherein the first and second interdigital sub-transducers are connected in parallel with each other and are excited in such a way as to be of opposite phases.

12. The surface acoustic wave device according to claim 1, wherein the piezoelectric plate is a K-cut quartz crystal.

13. The surface acoustic wave device according to claim 12, wherein a finger overlap width of each of the surface acoustic wave devices is 10 to 30 times a wavelength of a surface acoustic wave.

14. The surface acoustic wave device according to claim 12, wherein the constant a, by which a transverse mode frequency of each of the surface acoustic wave resonators is determined, is in a range of 0.01 to 0.02.

15. The surface acoustic wave device according to claim 12, wherein a distance between each pair of the surface acoustic wave resonators is 1 to 5 times the wavelength of a surface acoustic wave.

16. The surface acoustic wave device according to claim 1, wherein the piezoelectric plate is an ST-cut quartz crystal.

17. The surface acoustic wave device according to claim 16, wherein a finger overlap width of each of the surface acoustic wave devices is 10 to 30 times the wavelength of a surface acoustic wave.

18. The surface acoustic wave device according to claim 16, wherein the constant a, by which a transverse mode frequency of each of the surface acoustic wave resonators is determined, is in a range of 0.03 to 0.04.

19. The surface acoustic wave device according to claim 16, wherein a distance between each pair of the surface acoustic wave devices is 1 to 5 times the wavelength of a surface acoustic wave.

20. A method for designing a surface acoustic wave device having first and second surface acoustic wave resonators placed on a piezoelectric plate in such a way as to be proximate to one another, each of the first and second surface acoustic wave resonators comprising at least one interdigital transducer and at least one pair of reflectors, the surface acoustic wave resonators being adapted to have different frequency-temperature characteristics, a transverse elastic coupling of the surface acoustic wave resonators being performed in such a way that the surface acoustic wave resonators compose a single coupling resonator, the method comprising:

a first step of determining a resonance frequency (f) of the surface acoustic wave device;

a second step of determining film thicknesses of the interdigital transducers in such a way that peak temperatures of the first and second surface acoustic wave resonators are different from one another;

a third step of finding a difference $\Delta$ between a first resonance frequency, which is obtained at the peak temperature of the first surface acoustic resonator, and a second resonance frequency, which is obtained at the peak temperature of the second surface acoustic resonator, according to the film thicknesses; and a fourth step of setting an electrode pitch of the first surface acoustic wave resonator and an electrode pitch of the second surface acoustic wave resonator in such a manner as to cancel the difference $\Delta$ between the first resonance frequency and the second resonance frequency.

21. The method according to claim 20, wherein in the fourth step, the electrode pitch P is set according to the following equation:

$$P=Vs/\{2(f\pm\Delta/2)\}$$

where Vs designates the velocity of a surface acoustic wave; f the resonance frequency; and $\Delta$ the difference between the first resonance frequency and the second resonance frequency.

22. A method for designing a surface acoustic wave device having first and second surface acoustic wave resonators placed on a piezoelectric plate in such a way as to be proximate to one another, each of the first and second surface acoustic wave resonators consisting of at least one interdigital transducer and at least one pair of reflectors, the surface acoustic wave resonators being adapted to have different frequency-temperature characteristics, a transverse elastic coupling of the surface acoustic wave resonators being performed in such a way that the surface acoustic wave resonators compose a single coupling resonator, the method comprising:

a first step of determining a resonance frequency (f) of the surface acoustic wave device;

a second step of determining line widths of fingers of the interdigital transducers in such a way that peak temperatures of the first and second surface acoustic wave resonators are different from one another;

a third step of finding a difference ($\Delta$) between a first resonance frequency, which is obtained at the peak temperature of the first surface acoustic wave resonator, and a second resonance frequency, which is obtained at the peak temperature of the second surface acoustic wave resonator, according to the film thicknesses; and a fourth step of setting an electrode pitch of the first surface acoustic wave resonator and an electrode pitch of the second surface acoustic wave resonator in such a manner as to cancel the difference ($\Delta$) between the first resonance frequency and the second resonance frequency.

23. The method according to claim 22, wherein in the fourth step, the electrode pitch P is set according to the following equation:

$$P=Vs/\{2(f\pm\Delta/2)\}$$

where Vs designates the velocity of a surface acoustic wave; f the resonance frequency; and $\Delta$ the difference between the first resonance frequency and the second resonance frequency.

* * * * *